(12) United States Patent
Kato

(10) Patent No.: US 6,525,979 B2
(45) Date of Patent: Feb. 25, 2003

(54) SEMICONDUCTOR MEMORY DEVICE AND METHOD FOR READING INFORMATION OF THEREFROM

(75) Inventor: Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/968,803

(22) Filed: Oct. 3, 2001

(65) Prior Publication Data

US 2002/0118588 A1 Aug. 29, 2002

(30) Foreign Application Priority Data

Feb. 27, 2001 (JP) ..................................... 2001-051889

(51) Int. Cl.[7] .............................................. G11C 7/00
(52) U.S. Cl. ..................... 365/210; 365/206; 365/207; 365/230.06
(58) Field of Search ......................... 365/210, 230.06, 365/205, 206, 207

(56) References Cited

U.S. PATENT DOCUMENTS 5,022,009 A * 6/1991 Terada et al. ............... 365/210
5,062,079 A * 10/1991 Tsuchida et al. ............ 365/210
5,841,720 A * 11/1998 Covino et al. .............. 365/210
6,297,999 B2 * 10/2001 Kato et al. .................. 365/210

* cited by examiner

Primary Examiner—Son T. Dinh
(74) Attorney, Agent, or Firm—Armstrong, Westerman & Hattori, LLP

(57) ABSTRACT

A semiconductor memory device including a memory cell for holding charge of first cell information or second cell information, a word line connected to the memory cell for supplying the memory cell with word line voltage, a bit line connected to the memory cell for conveying charge corresponding to the first or second cell information, a dummy cell connected to the bit line for supplying the bit line with complementary charge, and a dummy word line connected to the dummy cell for supplying the dummy cell with dummy word line voltage. The first cell information is read based on the charge conveyed to the bit line from the memory cell when the word line is activated, and the second cell information is read based on the complementary charge supplied to the bit line from the dummy cell when the dummy word line is activated.

25 Claims, 16 Drawing Sheets

Fig.21A  Fig.21B  Fig.21C
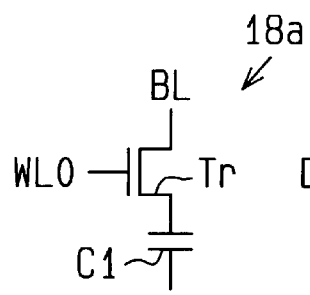 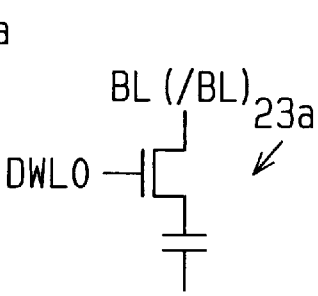 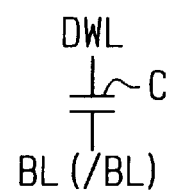
Fig.21D  Fig.21E  Fig.21F  Fig.21G
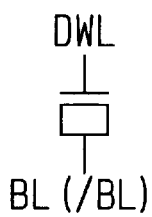 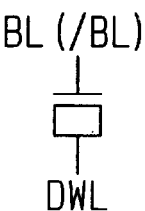 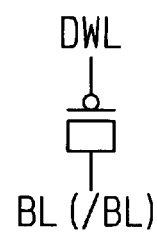 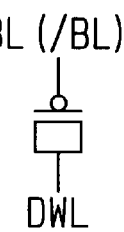
Fig.22
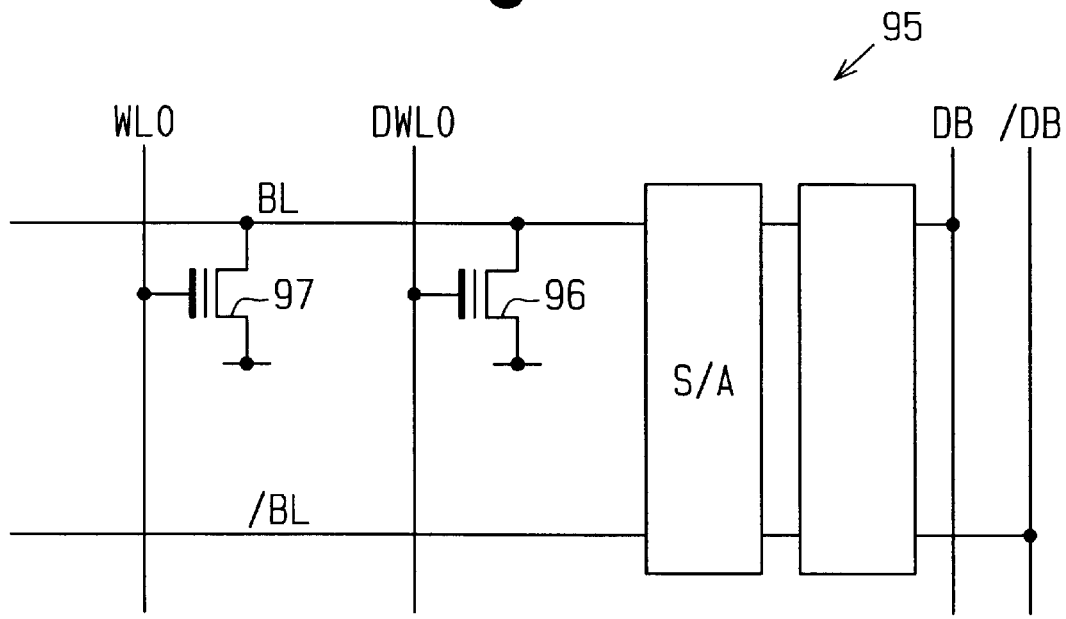

SEMICONDUCTOR MEMORY DEVICE AND METHOD FOR READING INFORMATION OF THEREFROM

BACKGROUND OF THE INVENTION

The present invention relates to a semiconductor memory device and a method for reading information from the semiconductor memory device.

Recent dynamic random access memory devices (DRAMs) have higher integration, larger capacity, and less power consumption. Due to the higher integration of memory cell arrays, the memory cells included in the memory cell arrays have become smaller. This leads to a tendency in which the amount of charge accumulates as cell information in cell capacitance of each memory cell decreases.

In such DRAM, power consumption is reduced by prolonging a self-refresh operation or by prolonging an external refresh operation. The DRAM has a dummy word line and a coupling capacitor to read normal cell information based on a small voltage output from a memory cell. The coupling capacitor is located between the dummy word line and a bit line. To read cell information, the dummy word line is selected to increase the voltage of the bit line in accordance with the charge of the capacitor and add the increased voltage to the small voltage read to the bit line. In such DRAM, improved refresh characteristics and higher integration are required.

FIG. 1 is a schematic circuit diagram of a conventional semiconductor memory device (DRAM) provided with a function for complementing cell information with a dummy line.

A cell array 1 includes a plurality (two in FIG. 1) of memory cells 2a, 2b. The memory cell 2a is connected to an intersection between a bit line BL and a word line WL0. The memory cell 2b is connected to an intersection between an inverting bit line /BL and a word line WL1.

The memory cell 2a includes a cell transistor Tr and a cell capacitance C1. The cell transistor Tr includes a first terminal connected to the bit line BL, a second terminal connected to the cell capacitance C1, and a gate connected to the word line WL0. The cell capacitance C1 has a first electrode connected to the cell transistor Tr and a second electrode supplied with a predetermined cell plate voltage. The cell plate voltage is, for example, one half the voltage of a cell power supply ViiC/2, which is supplied to the cell array 1 (hereafter referred to as ViiC/2 and depicted in FIG. 1 as ½ ViiC)

A sense amplifier 3 is connected to the bit lines BL, /BL to amplify the cell information read to the bit lines BL, /BL. The sense amplifier 3 receives activation voltages SAP, SAN, which are generated by a sense amplifier voltage generation circuit 4. The sense amplifier voltage generation circuit 4 receives a latch enable signal (sense amplifier activation signal) LE and generates the activation signals SAP, SAN based on the latch enable signal LE. The sense amplifier 3 is activated and inactivated based on the latch enable signal LE.

A dummy cell 5a is connected to an intersection between a bit line BL and a dummy word line DWL0. A dummy cell 5b is connected to an intersection between the inverting bit line /BL and a dummy word line DWL1. The dummy cells 5a, 5b have the same configuration as the memory cell 2a.

A row address decoder and a word driver (not shown) select one of the word lines WL0, WL1 based on a row address signal. Further, the row address decoder and a dummy word driver (not shown) select one of the dummy word lines DWL0, DWL1.

For example, when the memory cell 2a connected to the bit line BL is selected, the dummy word line DWL0 is selected to increase the voltage of the dummy word line DWL0 from power supply voltage Vss to power supply voltage Vii. When the memory cell 2b connected to the inverting bit line /BL is selected, the dummy word line DWL1 is selected to increase the voltage of the dummy word line DWL1 from the lower power supply voltage Vss to the high power supply voltage Vii. The high power supply voltage Vii is supplied to peripheral circuits, such as the row address decoder, the word driver, and the dummy word driver, from outside the DRAM 100. The high power supply voltage Vii is decreased to generate stable cell power supply voltage ViiC.

A read operation performed by the DRAM 100 will now be discussed with reference to FIGS. 2A and 2B. FIG. 2A is a waveform chart of the DRAM 100 taken when cell information "0" is read from the memory cell 2a. FIG. 2B is a waveform chart of the DRAM 100 taken when cell information "1" is read from the memory cell 2a.

The reading of cell information "0" will first be discussed. FIG. 2A shows voltage changes of the bit lines BL, /BL, the word line WL0, the dummy word line DWL1, and the latch enable signal LE. In this case, the voltage Vst at a storage node between the cell transistor Tr and a capacitor C1 of the memory cell 2a corresponds to the low power supply voltage Vss.

Prior to an operation for reading cell data, the bit lines BL, /BL are precharged to voltage ViiC/2 by a precharge circuit. The voltage of the dummy word line DWL0 is reset to the lower power supply voltage Vss.

Then, the word line WL0 is selected based on the row address signal and the voltage at the word line WL0 is increased from the low power supply voltage Vss to a step up voltage Vpp. In this state, when the voltage at the word line WL0 increases from the lower power supply voltage Vss by a threshold value Vthcell of the cell transistor Tr, cell information "0" is read to the bit line BL from the memory cell 2a and the voltage at the bit line BL decreases from ViiC/2.

In this state, when the dummy word line DWL0 is selected and the voltage at the dummy word line DWL0 is increased from the lower power supply voltage Vss to the high power supply voltage Vii, the charge of the dummy cell 5a increases the voltage at the bit line BL. The cell capacitor of the dummy cell 5a is set so that the increased voltage at the bit line BL is recognized as a low level by the sense amplifier 3. The cell capacitance of the dummy cell 5b is also set in the same manner. A differential voltage between the bit lines BL, /BL is amplified by the sense amplifier 3 that is activated by the latch enable signal LE. As a result, the voltage at the bit line BL changes to the lower power supply voltage Vss and cell information "0" is output from the bit line BL.

When cell information "1" is stored in the memory cell 2a, the voltage at the storage node between the cell transistor Tr and the capacitor C1 of the memory cell 2a corresponds to the cell power supply voltage ViiC.

In the state of FIG. 2B, the bit lines BL, /BL are precharged to the voltage ViiC/2 by the precharge circuit prior to the operation for reading the cell information. The dummy word lines DWL0, DWL1 are reset to the lower power supply voltage Vss.

Then, the word line WL0 is selected based on the row address signal and the voltage at the word line WL0 is increased from the low power supply voltage Vss to the step up voltage Vpp. In this state, when the voltage at the word line WL0 increases from the precharge voltage ViiC/2 by the threshold value Vthcell of the cell transistor Tr, cell information "1" is read to the bit line BL from the memory cell 2a and the voltage at the bit line BL increases from the precharge level (ViiC/2).

In this state, when the dummy word line DWL0 is selected and the voltage at the dummy word line DWL0 is increased from the lower power supply voltage Vss to the high power supply voltage Vii, the charge of the dummy cell 5a increases the voltage at the bit line BL. This increases the differential voltage between the bit lines BL, /BL and effectively increases the charge of the cell. Thus, the interval for refreshing the memory cells 2a, 2b is lengthened.

The differential voltage between the bit lines BL, /BL is amplified by the sense amplifier 3 that is activated by the latch enable signal LE. As a result, the voltage at the bit line BL shifts to the high power supply voltage ViiC and cell information "1" is output from the bit line BL.

The threshold value voltage Vthcell of the cell transistor Tr when reading cell information "0" differs in specifics from that of cell transistor Tr when reading cell information "1". However, since the same operation is performed, the same reference character (Vthcell) is used.

The prior art method has the shortcomings discussed below.

(1) When the charge amount of the storage capacitor C1 associated with the cell information "1" decreases due to, for example, a leak, the cell storage voltage (voltage at the storage node) Vst decreases to a value less than or equal to the precharge voltage (ViiC/2). In this case, the cell information "1" cannot be read.

(2) The data holding time, or refresh cycle (tREF), of the memory cells 2a, 2b determines the current consumption during self-refreshing. When the refresh cycle tREF is short, the number of times self-refreshing is performed increases. This increases the self-refresh current.

(3) The time from word line activation to sense amplifier activation depends on the time required for the cell information "1" to be read from the memory cell 2a to the bit line BL. Further, the time from word line activation to sense amplifier activation is significantly affected by the threshold value Vthcell of the cell transistor Tr.

When the voltage at word line WL0 increases to the voltage required for reading the cell information (Viic/2+ Vthcell), the cell information "1" is read to the bit line BL. Thus, if the rising edge of the word line voltage VWL has a gradual waveform, the time for reading data increases and the data read cycle time becomes longer. To prevent the rising edge waveform of the word line voltage VWL from becoming too gradual, the time constant (resistance and parasitic capacitance) of the word line must be decreased. To do so, an increase in the number of address decoders and word drivers required to drive the word line would enlarge the chip of the semiconductor memory device.

SUMMARY OF THE INVENTION

It is an object of the present invention to provide a semiconductor memory device that having improved characteristics for reading data stored thereon and a method for reading cell information from the inventive semiconductor memory device.

To achieve the above object, the present invention provides a semiconductor memory device including a memory cell for holding charge of first cell information or second cell information. The first cell information is associated with logic level "0", and the second cell information is associated with logic level "1". A word line is connected to the memory cell for supplying the memory cell with word line voltage. A bit line is connected to the memory cell for conveying the charge corresponding to the first or second cell information from the memory cell. A dummy cell is connected to the bit line for supplying the bit line with complementary charge. A dummy word line is connected to the dummy cell for supplying the dummy cell with dummy word line voltage. The first cell information is read based on the charge conveyed to the bit line from the memory cell when the word line is activated, and the second cell information is read based on the complementary charge supplied to the bit line from the dummy cell when the dummy word line is activated.

A further aspect of the present invention is a semiconductor memory device including a plurality of memory cells for storing first cell information or second cell information. The first cell information is associated with logic level "0", and the second cell information is associated with logic level "1". A plurality of word lines are connected to the memory cells for supplying the memory cells with word line voltage. A plurality of bit lines are connected to the memory cells for conveying charge corresponding to the first or second cell information from one of the memory cells. A plurality of dummy cells are connected to the bit lines for supplying an associated one of the bit lines with complementary charge. A plurality of dummy word lines are connected to the dummy cells for supplying the associated one of the dummy cells with dummy word line voltage. The first cell information is read based on the charge conveyed to the bit line associated with the memory cell connected to an activated one of the word lines, and the second cell information is read based on the complementary charge supplied to the bit line associated with the dummy cell connected to an activated one of the dummy word lines.

A further aspect of the present invention is a method for reading cell information from a semiconductor memory device. The semiconductor memory device includes a plurality of memory cells for holding charge corresponding to first cell information or second cell information. A plurality of pairs of bit lines are connected to the memory cells. Each pair of bit lines includes a bit line and an inverting bit line. The first cell information is associated with logic level "0", and the second cell information is associated with logic level "1". A plurality of word lines are connected to the memory cells for supplying the memory cells with word line voltage. A plurality of bit lines are connected to the memory cells for receiving charge corresponding to the first or second cell information from one of the memory cells. A plurality of dummy cells are connected to the pairs of bit lines for supplying an associated one of the pair of bit lines with complementary charge. A plurality of dummy word lines are connected to the dummy cells for supplying the associated one of the dummy cells with dummy word line voltage. A plurality of sense amplifiers are connected to the pairs of bit lines for amplifying the voltage between the associated one of the pairs of bit lines. The method includes a first step for activating at least one of the word lines, a second step for providing the first cell information to the bit line associated with the memory cell connected to the activated one of the word lines from the connected memory cell, a third step for activating at least one of the dummy word lines, a fourth step for supplying the complementary charge to the bit line associated with the dummy cell connected to the activated one of the dummy word lines from the connected dummy cell, and a fifth step for activating the sense amplifier connected to the bit line supplied with the complementary charge before the second cell information is read to the bit line.

A further aspect of the present invention is a method for reading cell information from a semiconductor memory device. The semiconductor memory device includes a plurality of memory cells for holding charge corresponding to first cell information or second cell information. A plurality of pairs of bit lines are connected to the memory cells. Each pair of bit lines includes a bit line and an inverting bit line. The first cell information is associated with logic level "0", and the second cell information is associated with logic level "1". A plurality of word lines are connected to the memory cells for supplying the memory cells with word line voltage. A plurality of bit lines are connected to the memory cells for receiving charge corresponding to the first or second cell information from one of the memory cells. A plurality of dummy cells are connected to the pairs of bit lines for supplying an associated one of the pair of bit lines with complementary charge. A plurality of dummy word lines are connected to the dummy cells for supplying the associated one of the dummy cells with dummy word line voltage. A plurality of sense amplifiers are connected to the pairs of bit lines for amplifying the voltage between the associated one of the pairs of bit lines. Each of the memory cells has a cell transistor threshold value voltage, a precharge voltage, a first sum voltage of the threshold value voltage and the precharge voltage, a write voltage for writing the second information to the memory cell, and a second sum voltage of the write voltage and the threshold value voltage. The method includes a first step for increasing voltage of at least one of the word lines from a reference voltage to a value greater than or equal to the threshold value voltage and less than the first sum voltage, a second step for providing the charge corresponding to the first cell information to the bit line associated with the memory cell connected to the at least one of the word lines, a third step for activating at least one of the dummy word lines, a fourth step for supplying the complementary charge to the bit line associated with the dummy cell connected to the activated one of the dummy word lines from the connected dummy cell, a fifth step for activating the sense amplifier connected to the bit line supplied with the complementary charge before the second cell information is read to the connected bit line from the memory cell, and a sixth step for increasing voltage at the at least one of the word lines to a value that is greater than or equal to the second sum voltage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 8A represents a prior art SDRAM and FIGS. 8B represents the semiconductor memory device of FIG. 3;

FIGS. 10A represents the semiconductor memory device of FIG. 3 and FIGS. 10B represents a prior art SDRAM;

FIGS. 21A to 21G are explanatory diagrams of other dummy cells; and

FIG. 22 is a partial block diagram of a semiconductor memory device according to a further embodiment of the present invention.

DETAILED DESCRIPTION OF THE PREFERRED EMBODIMENTS

Figure 1:
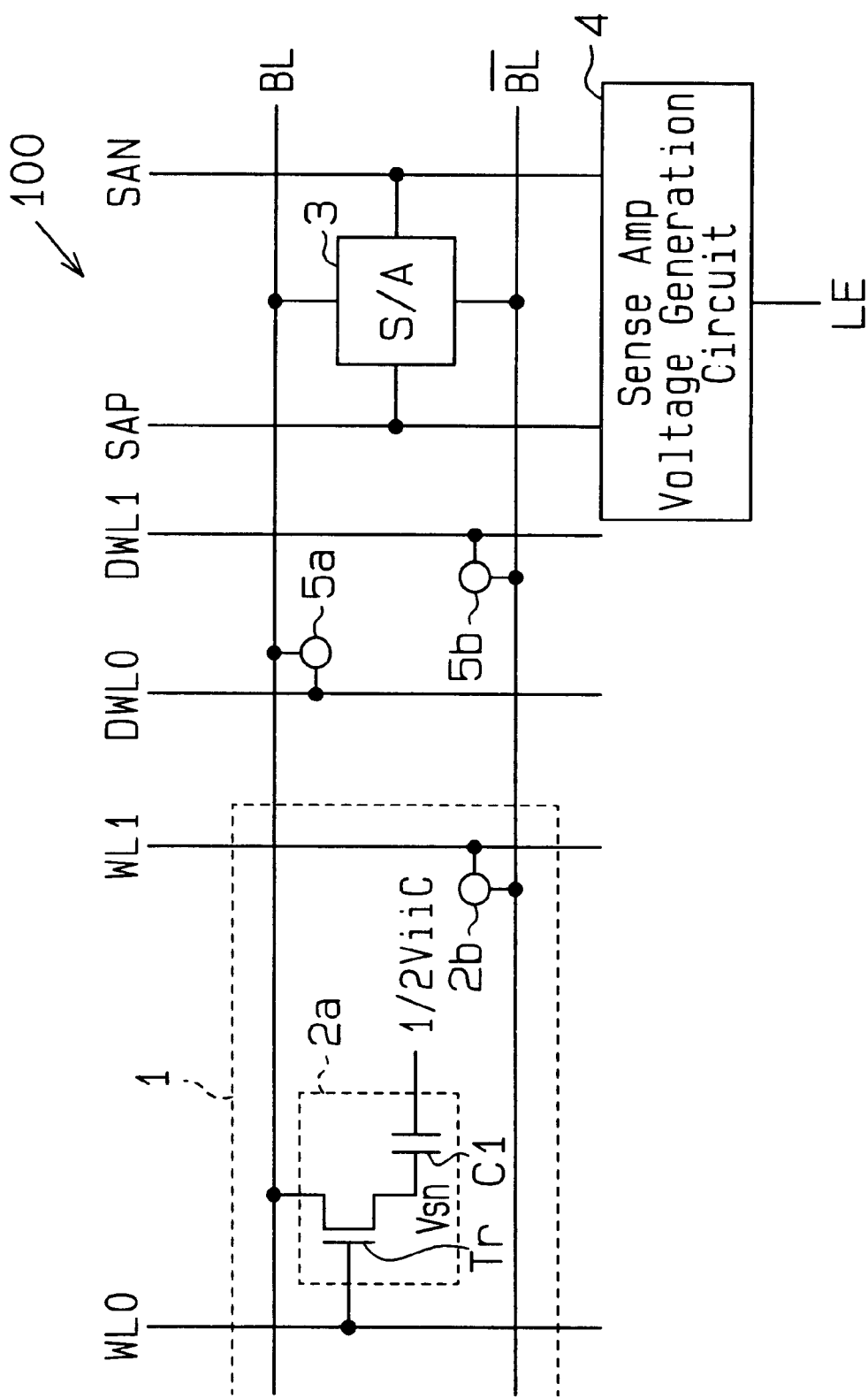
FIG. 1 is a schematic circuit diagram of a prior art semiconductor memory device.
Figure 2A:
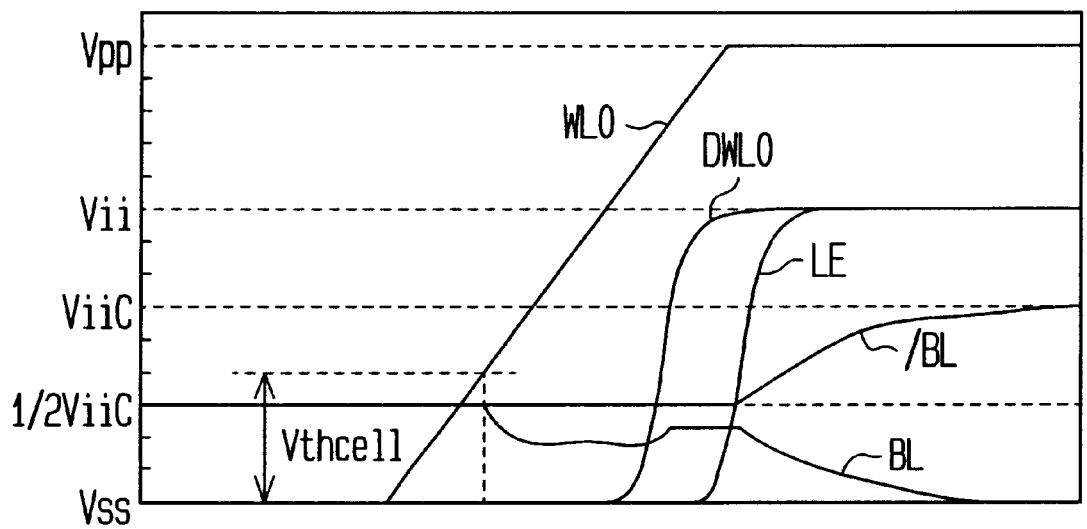
FIGS. 2A and 2B are charts showing the waveform of the semiconductor memory device of FIG. 1.
Figure 2B:
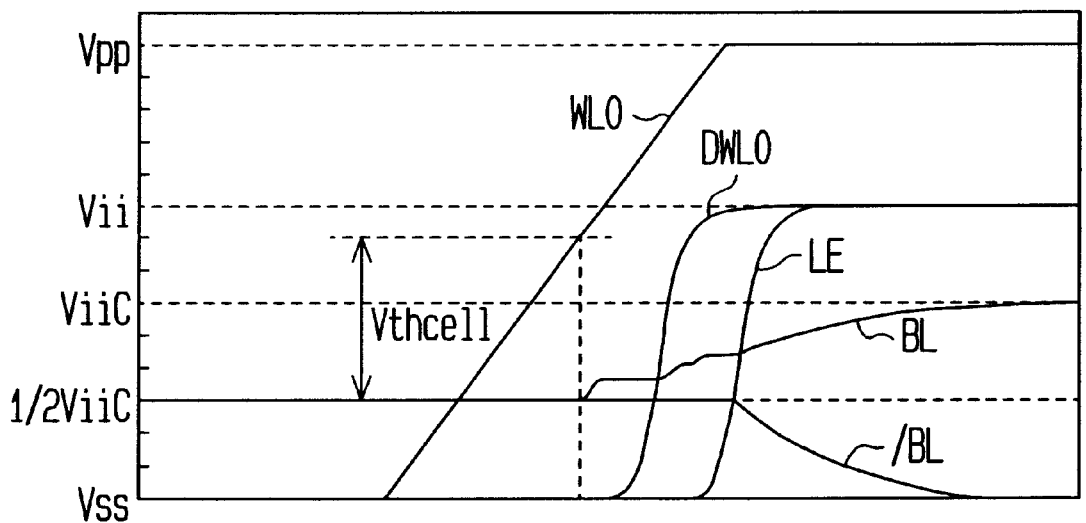

In the drawings, like numerals are used for like elements throughout.

Figure 3:
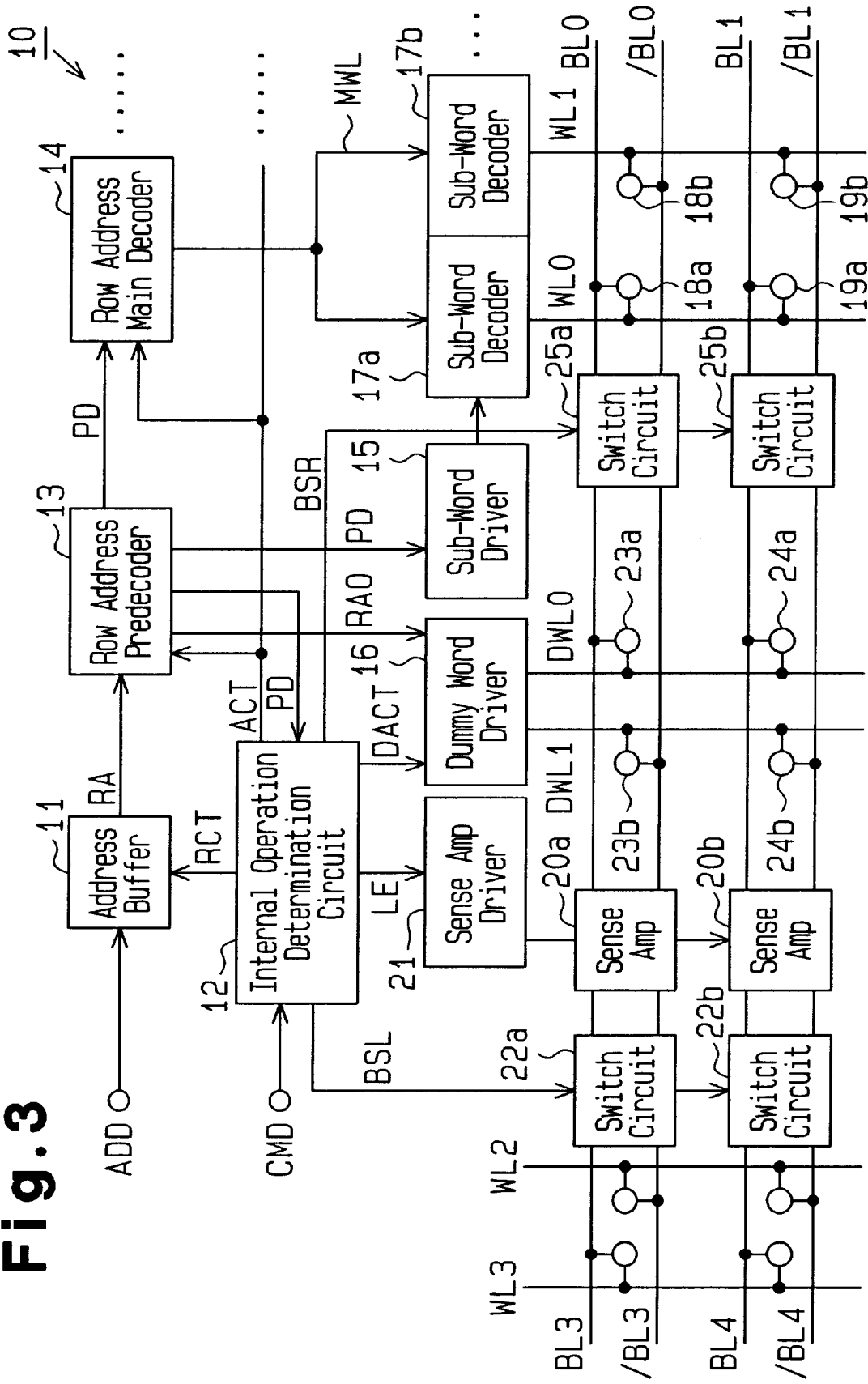
FIG. 3 is a schematic block diagram of a semiconductor memory device according to a first embodiment of the present invention.

FIG. 3 is a schematic block diagram of a semiconductor memory device (SDRAM) 10 according to a first embodiment of the present invention. FIG. 3 shows sections of the SDRAM 10 used to drive word lines and dummy word lines of the SDRAM 10.

The SDRAM 10 includes an address buffer 11, an internal operation determination circuit 12, a row address predecoder 13, and a plurality of row address main decoders 14.

The SDRAM 10 receives the address signal ADD and the external command signal CMD. The address signal ADD is provided to the address buffer 11, and the external command signal CMD is provided to the internal operation determination circuit 12. The address signal ADD includes the row address signal RA. The external command signal CMD includes a plurality of signals.

The internal operation determination circuit 12 decodes the external command signal CMD and generates various commands, such as an activating command and a read command. The internal operation determination circuit 12 provides the address buffer 11 with a control signal RCT to receive the row address signal RA. The internal operation determination circuit 12 generates an activation signal ACT based on the decoding of the activating command and provides the activation signal ACT to the row address predecoder 13 and the row address main decoders 14.

The address buffer 11 operates in response to the control signal RCT and buffers the received row address signal RA. The buffered row address signal RA is provided to the row address predecoder 13.

The row address predecoder 13 decodes the row address signal RA based on the activation signal ACT to generate a predecode signal PD. The predecode signal PD is provided to the internal operation determination circuit 12, the row address main decoders 14, and sub-word drivers 15. The row address predecoder 13 provides a dummy word driver 16 with an address signal RA0, which is one of the signals of the row address signal RA.

The row address main decoders 14 are each connected to a main word line MWL. Further, the row address main decoders 14 each decode the predecode signal PD based on the activation signal ACT. The row address main decoder 14 selected by the predecode signal PD activates the main word line MWL.

A plurality of sub-word decoders including first and second sub-word decoders 17a, 17b, as shown in FIG. 3, are connected to the main word line MWL. The first and second sub-word decoders 17a, 17b are respectively connected to first and second sub-word lines (hereinafter, simply referred to as word lines) WL0, WL1.

The number of the sub-word drivers 15 corresponds to the number of the sub-word decoders. The sub-word drivers 15 each generate a drive signal for driving word lines WL0, WL1 based on the predecode signal PD and provides the drive signal to the first and second sub-word decoders 17a, 17b. When the main word line MWL is activated, the first and second sub-word decoders 17a, 17b activate the first word line WL0 or the second word line WL1 based on the drive signal provided from the sub-word driver 15.

A memory cell 18a is connected to the intersection between the first word line WL0 and a perpendicular first bit line BL0. A memory cell 19a is connected to the intersection between the first word line WL0 and a perpendicular second bit line BL1. A memory cell 18b is connected to the intersection between the second word line WL1 and a perpendicular first bit line /BL0. A memory cell 19b is connected to the intersection between the second word line WL1 and a perpendicular second bit line /BL1. The memory cells 18a–19b each have the same configuration as the memory cell 2a of FIG. 1.

A memory block includes the first and second word lines WL0, WL1, the pair of first bit lines BL0, /BL0, the pair of second bit lines /BL0, /BL1, and the memory cells 18a–19b.

The voltage at each of the bit lines BL0, /BL0, BL1, /BL1 changes based on the cell information held in the memory cells 18a–19b. For example, when the first word line WL0 is activated, the voltages at the bit lines BL0, BL1 change based on the cell information of the memory cells 18a, 19a connected to the first word line WL0. That is, the cell information of the memory cells connected to the activated word line is read to the bit line that is connected to each memory cell.

The timing for changing the voltage at each of the bit lines BL0-/BL1 depends on the cell information of the connected memory cells 18a–19b. For example, when the memory cell 18a holds cell information "0" and the memory cell 19a holds cell information "1", an increase in the voltage at the first word line WL0 from the power supply Vss level by the threshold value Vthcell of the cell transistor Tr causes the cell information "0" of the memory cell 18a to decrease the voltage at the bit line BL0. Further, when the voltage at the first word line WL0 increases by the precharge voltage Vpr (ViiC/2), the cell information "1" of the memory cell 19a increases the voltage at the bit line BL1.

In other words, when the first word line WL0 is activated, if the word line voltage increases by a value that is greater than or equal to the threshold value of the cell transistor, the cell information "0" is provided from the memory cell to the bit line BL0 or the bit line BL1. Then, when the word line voltage increases by a value that is greater than or equal to the sum of the precharge voltage and the threshold value of the cell transistor, the cell information "1" is provided to the bit line BL0 or the bit line BL1.

Specifically, the threshold value voltage Vthcell of the cell transistor Tr (hereinafter, simply referred to as threshold value voltage) when reading cell information "0" differs from that when reading cell information "1". However, the same operation is performed. Thus, the same reference character (Vthcell) is used for each threshold value voltage.

The pair of bit lines BL0, /BL0 are connected to a switch circuit 25a, and the pair of bit lines BL1, /BL1 are connected to a switch circuit 25b. The switch circuit 25a is connected to a sense amplifier 20a by a pair of bit lines. The sense amplifier 20a is further connected to a switch circuit 22a by a pair of bit lines. A pair of bit lines BL3, /BL3 are connected to the switch circuit 22a.

The switch circuit 25b is connected to a sense amplifier 20b by a pair of bit lines. The sense amplifier 20b is further connected to a switch circuit 22b by a pair of bit lines. A pair of bit lines BL4, /BL4 are connected to the switch circuit 22b.

Memory cells (not denoted by reference numbers) are connected to the intersections between the pair of bit lines BL3, /BL3 and third and fourth word lines WL2, WL3. Memory cells are connected to the intersections between the pair of bit lines BL4, /BL4 and third and fourth word lines WL2, WL3.

The memory block includes the third and fourth word lines WL2, WL3, the bit lines BL3, /BL3, BL4, /BL4, and the connected memory cells. The third and fourth word lines WL2, WL3 are driven by a circuit (not shown) similar to the circuit that drives the first and second word lines WL0, WL1.

The switch circuits 25a, 25b are each activated and inactivated based on a block selection signal BSR generated by the internal operation determination circuit 12. Accordingly, the pair of bit lines BL0, /BL0 or the pair of bit lines BL3, /BL3 are connected to the sense amplifier 20a via the switch circuit 25a or the switch circuit 22a. The pair of bit lines BL1, /BL1 or the pair of bit lines BL4, /BL4 are connected to the sense amplifier 20b via the switch circuit 25b or the switch circuit 22b.

The sense amplifiers 20a, 20b are operated by the activating voltage supplied from a sense amplifier driver 21. The sense amplifier 20a amplifies the differential voltage between the pair of bit lines BL0, /BL0 or between the pair of bit lines BL3, /BL3. The sense amplifier 20b amplifies the differential voltage between the pair of bit lines BL1, /BL1 or between the pair of bit lines BL4, /BL4.

In the vicinity of the sense amplifier 20a, dummy cells 23a, 23b are connected to the intersections between the pair of bit lines BL0, /BL0, which are connected to the sense amplifier 20a, and perpendicular dummy word lines DWL0, DWL1. In the vicinity of the sense amplifier 20b, dummy cells 24a, 24b are connected to the intersections between the pair of bit lines BL1, /BL1, which are connected to the sense amplifier 20b, and the perpendicular dummy word lines DWL0, DWL1.

Like the memory cells 18a–19b, the dummy cells 23a–24b each include a transistor and a cell capacitor (refer to FIG. 1). The transistor of each dummy cell 23a–24b is configured to have the same electric characteristic as the cell transistor Tr of each memory cell 18a–19b.

The capacitance of the dummy cells 23a–24b is smaller than that of the memory cells 18a–19b. In the first embodiment, the capacitance value of the dummy cells 23a–24b is set at half the capacitance value of the memory cells 18a–19b. Accordingly, the dummy cells 23a–24b are each accumulated with one half the charge of each of the memory cells 18a–19b. The storage voltage Vst of the dummy cells 23a, 24a, 24b is less than or equal to the cell voltage Viic.

The first and second dummy word lines DWL0, DWL1 are connected to the dummy word driver 16. The dummy word driver 16 receives the address signal RA0 from the row address predecoder 13 and an activation signal DACT from the internal operation determining circuit 12. When the dummy word driver 16 is activated by the activation signal DACT, the dummy word driver 16 activates the first dummy word line DWL0 or the second dummy word line DWL1 based on the address signal RA0.

When the first dummy word line DWL0 is activated, the charge of the dummy cells 23a, 24a increases the voltages at the bit lines BL0, BL1. When the second dummy word line DWL1 is activated, the charge of the dummy cells 23b, 24b increases the voltages at the inverting bit lines /BL0, /BL1.

The dummy word driver 16 increases the voltage at the bit lines BL0–/BL1 to which the cell information of the memory cells 18a–19b have been read by the activation of the first and second word lines WL0, WL1.

As an example, the operation of the dummy word driver 16 when cell information "1" is stored in the memory cell 18a will now be discussed. In this case, if the voltage at the first word line WL0 is less than or equal to the sum of the bit line precharge voltage Viic/2 and the threshold value voltage Vthcell, the voltage at the bit line BL0 does not change even if the first word line WL0 is activated. In this state, the dummy word driver 16 activates the first dummy word line DWL0. This causes the charge of the dummy cell 23a to increase the voltage at the first bit line BL0. As a result, the differential voltage between the first bit line BL0 and the first inverting bit line /BL exceeds the sensitivity of the sense amplifier 20a.

An example in which the memory cell 18a stores cell information "0" will now be discussed. In this case, when the first word line WL0 is activated, the voltage at the first bit line BL0 decreases slightly. When the dummy word driver 16 activates the first dummy word line DWL0, the charge of the dummy cell 23a increases the voltage at the first bit line BL0.

The increased voltage at the first bit line BL0 is equal to a generally median voltage between the precharge voltage ViiC/2 and the voltage decreased by the cell information "0" since the dummy cell 23a has a capacitance value that is one half of the memory cell 18a. The voltages at the bit lines /BL0, BL1, /BL1 are changed in the same manner by the other dummy cells 23a–24b.

When the decoded command is an activating command, the internal operation determining circuit 12 provides the dummy word driver 16 with the activation signal DACT and the sense amplifier driver 21 with the activation signal LE at a predetermined timing after outputting the activation signal ACT.

The dummy word driver 16 outputs the activation signal DACT at a first timing t1 (refer to FIG. 7). The first timing is set at a timing between a timing when the cell information "0" is read and a timing when the cell information "1" is read to the bit line. The activation signal LE of the sense amplifier driver 21 is output at timing t2 (refer to FIG. 7). Timing t2 is set between the first timing t1 and a timing at which the cell information "1" is read to the bit line.

Figure 4:
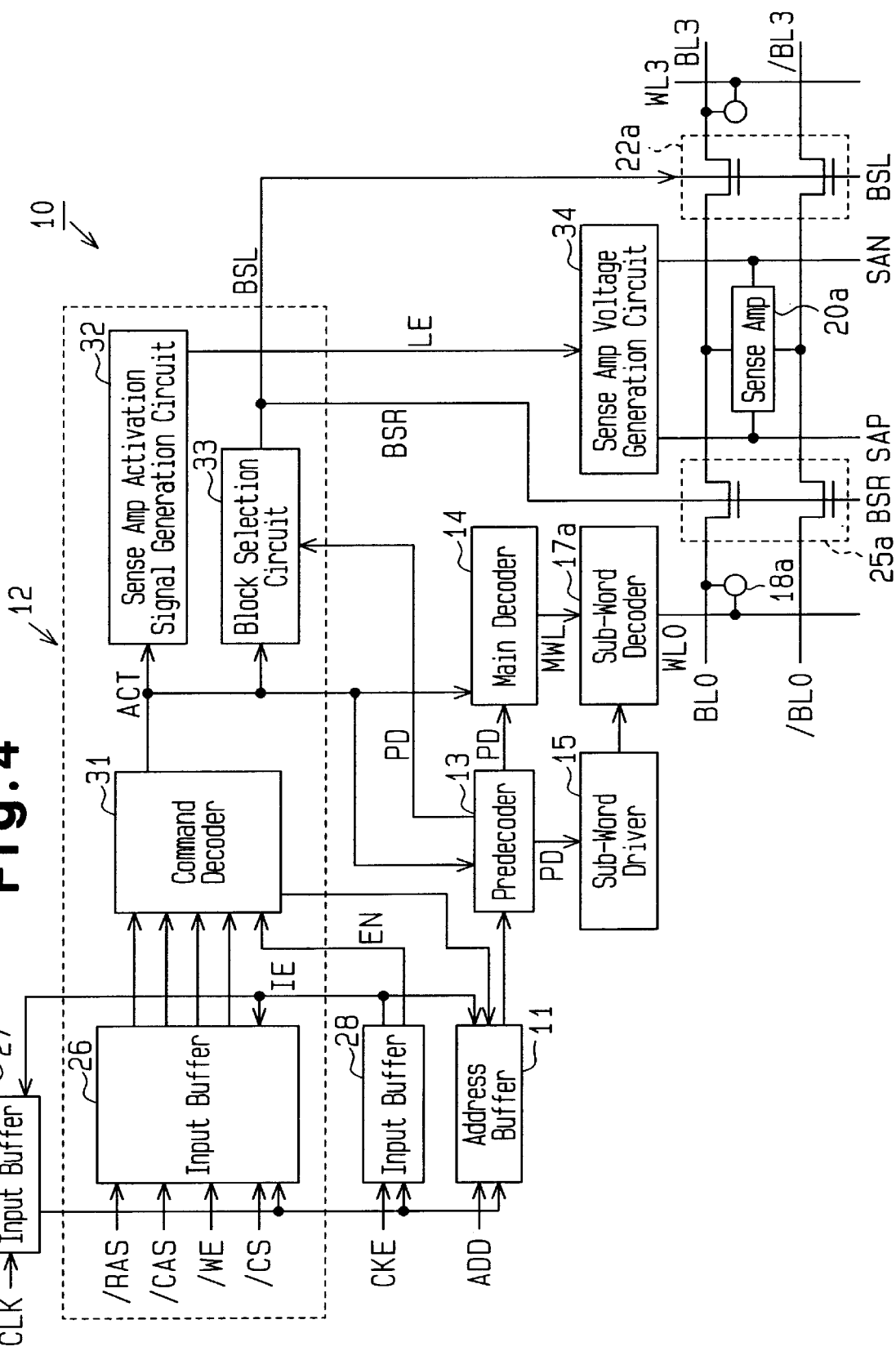
FIG. 4 is a schematic block diagram of an internal operation determination circuit of the semiconductor of FIG. 3.

FIG. 4 is a schematic block diagram showing the internal operation determination circuit 12 connected to peripheral circuits.

The DRAM 10 receives an external clock signal CLK and a clock enable signal CKE together with the external address signal ADD and the external command signal CMD. The SDRAM 10 includes input buffers 11, 26, 27, 28, which respectively buffer the signals ADD, CMD, CLK, CKE. The internal operation determination circuit 12 includes an input buffer 26, a command decoder 31, a sense amplifier activation signal generation circuit 32, and a block selection circuit 33.

The input buffer 27 receives the external clock signal CLK and buffers the signal CLK. The input buffer 27 generates an internal clock signal from the buffered external clock signal CLK. The input buffers 11, 26, 28 each receive the internal clock signal and acquires an external input signal based on the internal clock signal. The external input signal is provided to the command decoder 31.

The input buffer 28 receives and buffers the clock enable signal CKE. The input buffer 28 generates an input activation signal IE and an enable signal EN based on the buffered clock enable signal CKE. The input activation signal IE activates the input buffers 11, 26. The input buffer 11 buffers the external address signal ADD, and the input buffer 26 buffers the external command signal CMD.

The external command signal CMD includes a row address strobe signal /RAS, a column address strobe signal /CAS, a write enable signal /WE, and a chip select signal /CS. The input buffer 26 buffers the signals /RAS, /CAS, /WE, /CS and provides the command decoder 31 with the buffered signals /RAS, /CAS, /WE, /CS.

The command decoder 31 decodes the signals /RAS, /CAS, /WE, /CS and generates various commands. The command decoder 31 provides the sense amplifier (SA) activation signal generation circuit 32, the block selection circuit 33, the predecoder 13, and the main decoder 14 with the activation signal ACT, which is an activating command. The activating command is a command for activating the block (or bank) that includes the memory cell that is to undergo reading or writing of cell information. The command decoder 31 first generates the activation signal ACT when reading cell information from a memory cell.

The S/A activation signal generation circuit 32 generates the sense amplifier activation signal LE based on the activation signal ACT and provides the sense amplifier activation signal LE to an SA voltage generation circuit 34. The SA activation signal generation circuit 32 includes a delay circuit (not shown) to delay the activation signal ACT. The SA activation signal generation circuit 32 validates the sense amplifier activation signal LE at the second timing based on the delayed activation signal ACT.

The SA voltage generation circuit 34 generates predetermined activation voltages SAP, SAN based on the sense amplifier activation signal LE and supplies the sense amplifier 20a with the activation voltages 20a. For example, the activation voltage SAP is the cell voltage ViiC, and the activation voltage SAN is the lower power supply voltage Vss. The activation voltages SAP, SAN, activate the sense amplifier 20a.

The block selection circuit 33 generates a first block selection signal BSR or a second block selection signal BSL based on the activation signal ACT and the predecode signal PD. The block selection circuit 33 provides the switch circuit 25a with the first block selection signal BSR and the switch circuit 22a with the second block selection signal BSL.

The switch circuit 25a includes two n-channel MOS transistors respectively connected to the bit lines BL0, /BL0. Each n-channel MOS transistor is activated and deactivated by the block selection signal BSR. The switch circuit 22a includes two n-channel MOS transistors respectively connected to the bit lines BL3, /BL3. Each n-channel MOS transistor is activated and deactivated by the block selection signal BSL. The activated transistor connects the pair of bit lines BL0, /BL0 or the pair of bit lines BL3, /BL3 of another block to the sense amplifier 20a.

Figure 5:
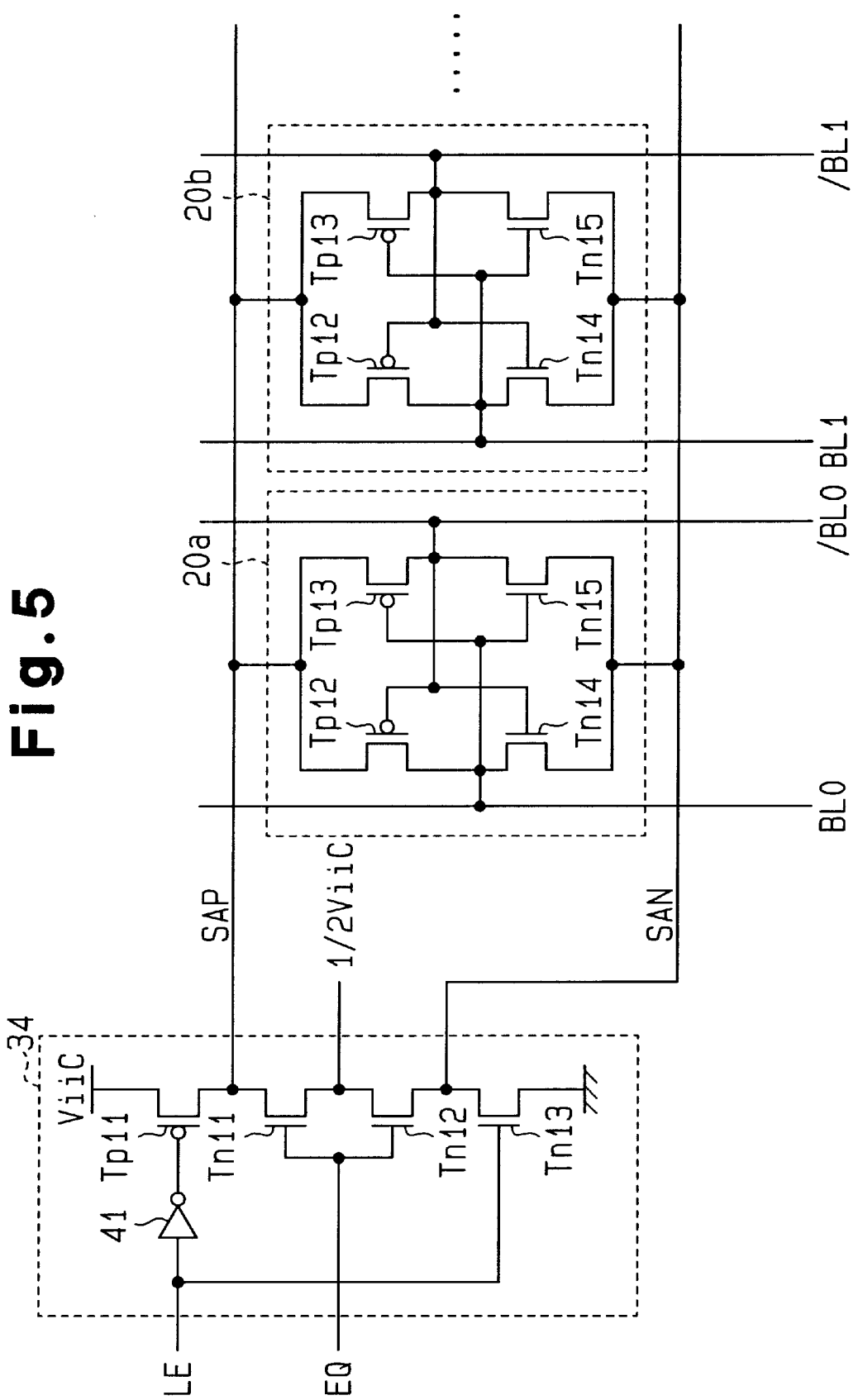
FIG. 5 is a circuit diagram of a sense amplifier driver and a sense amplifier of the semiconductor memory device of FIG. 3.

FIG. 5 is a circuit diagram of the SA voltage generation circuit 34 and the sense amplifiers 20a, 20b. The SA voltage generation circuit 34 includes an inverter circuit 41, a p-channel MOS transistor Tp11, and n-channel MOS transistors Tn11–Tn13.

The p-channel MOS transistor Tp11 and the n-channel MOS transistors Tn11–Tn13 are connected in series between the cell power supply ViiC and the low voltage power supply Vss. The gate of the transistor Tp11 is provided with the sense amplifier activation signal LE via the inverter circuit 41. The gate of the transistor Tn13 is provided with the sense amplifier activation signal LE. The gates of the transistors Tn11, Tn12 are provided with an equalization signal EQ.

The sense amplifiers 20a, 20b are supplied with the high potential voltage SAP from a node between the transistors Tp11, Tn11. The sense amplifiers 20a, 20b are supplied with the low potential voltage SAN from the drain of the transistor Tn13. The bit lines BL0, /BL0, BL1, /BL1 are supplied with a precharge voltage Vpr (ViiC/2) from a node between the transistors Tn11, Tn12.

The transistors Tp11, Tn13 of the SA voltage generation circuit 34 are activated when the sense amplifier activation signal LE goes high. In this state, the equalization signal EQ is sustained at a low level. This supplies the sense amplifiers 20a, 20b with the high potential voltage SAP, which is equal to the cell voltage ViiC, and the low potential voltage SAN, which is equal to the voltage Vss.

The transistors Tp11, Tn13 are inactivated when the sense amplifier activation signal LE goes low. In this state, the equalization signal EQ goes high, and the transistors Tn11, Tn12 are activated. This generates the precharge voltage Vpr, which is equal to a voltage at a median level between the voltages of the power supplies ViiC, Vss (ViiC/2).

The sense amplifiers 20a, 20b each include p-channel MOS transistors Tp12, Tp13 and n-channel MOS transistors Tn14, Tn15. The PMOS transistor Tp12 and the NMOS transistor Tn14 are connected in series between the high potential voltage SAP and the low potential voltage SAN. The PMOS transistor Tp13 and the NMOS transistor Tn15 are connected in series between the high potential voltage SAP and the low potential voltage SAN. The gates of the transistors Tp12, Tn14 are connected to the drains of the transistors Tp12, Tn14 and the bit line BL.

The sense amplifier 20a amplifies the differential voltage between the bit lines BL0, /BL0 to the differential voltage between the cell power supply ViiC and the low potential voltage Vss. The sense amplifier 20b amplifies the differential voltage between the bit lines BL1, /BL1 to the differential voltage between the cell power supply ViiC and the low potential voltage Vss.

Figure 6:
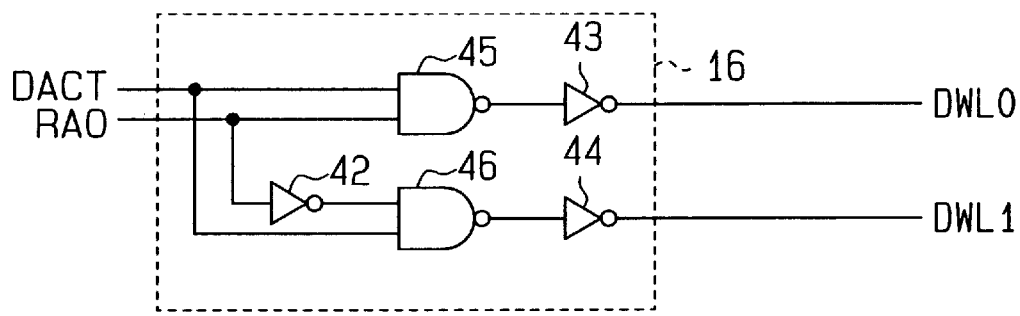
FIG. 6 is a schematic circuit diagram of a dummy word driver of the semiconductor memory device of FIG. 3.

FIG. 6 is a schematic circuit diagram of the dummy word driver 16. The dummy word driver 16 includes inverter circuits 42, 43, 44, a first NAND circuit 45, and a second NAND circuit 46.

The first NAND circuit 45 receives the dummy word activation signal DACT and the address signal RA0. The second NAND circuit 46 receives the dummy word activation signal DACT and the address signal RA0, which has been inverted by the first inverter circuit 42. The output terminals of the first and second NAND circuits 45, 46 are respectively connected to the second and third inverter circuits 43, 44. The output terminals of the second and third inverter circuits 43, 44 are respectively connected to the first and second dummy word lines DWL0, DWL1. The dummy word driver 16 receives the high power supply voltage Vii and the lower power supply voltage Vss.

The dummy word driver 16 selects the first dummy word line DWL0 or the second dummy word line DWL1 based on the address signal RA0 to drive the bit line connected to the memory cell from which cell information is to be read. When the dummy word driver 16 is activated by the dummy word activation signal DACT, the voltage at the selected first dummy word line DWL0 or the second dummy word line DWL1 is increased from the low power supply voltage Vss to the high power supply voltage Vii.

As an example, when reading the cell information of the memory cell 18a of FIG. 3, the dummy word driver 16 selects the first dummy word line DWL0, to which the dummy cell 23a is connected, to drive the bit line BL0 that is connected to the memory cell 18a. When the dummy word driver 16 is activated by the dummy word activation signal DACT, the dummy word driver 16 increases the voltage of the first dummy word line DWL0 from the low power supply voltage Vss to the high power supply voltage Vii.

Figure 7A:
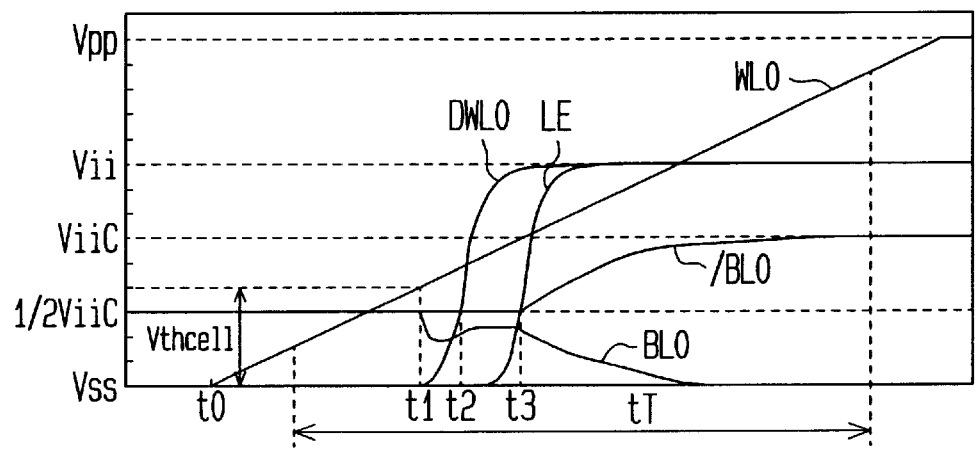
FIGS. 7A and 7B are charts showing the waveform of the semiconductor memory device of FIG. 3.
Figure 7B:
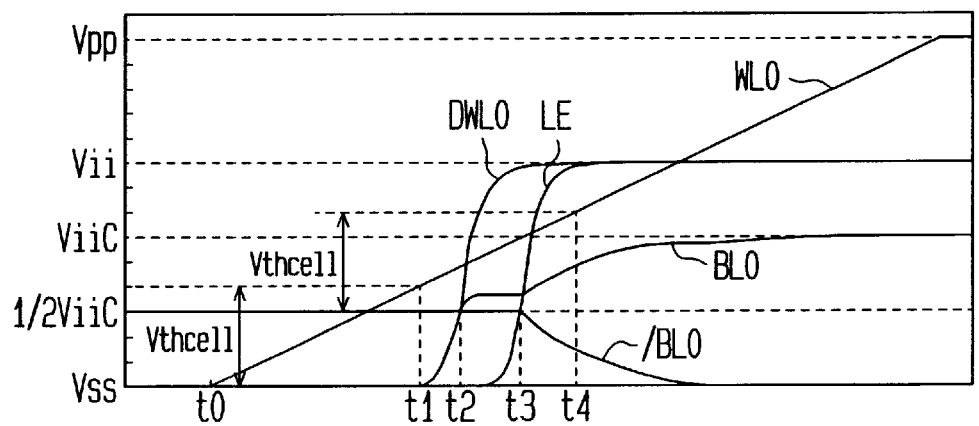

The operation of the SDRAM 10 will now be discussed with reference to FIGS. 7A and 7B. FIG. 7A is a waveform chart illustrating the operation of the SDRAM 10 when reading cell information "1" from the memory cell 18a.

The operation of the SDRAM 10 that is performed when reading cell information "0" will now be discussed. The storage voltage Vst of the memory cell 18a is equal to the low power supply voltage Vss, which corresponds to cell information "0". The bit lines BL0, /BL0 are precharged to voltage ViiC/2 prior to the reading of the cell information "0". The voltages at the dummy word lines DWL0, DWL1 are reset to the low power supply voltage Vss.

Then, the voltage at the word line WL0 selected by the row address signal RA is increased (time t0). When the voltage at the word line WL0 is increased from the low power supply voltage Vss by the threshold value voltage Vthcell (Vss+Vthcell) (time t1), cell information "0" is read to the bit line BL0 from the memory cell 18a and the voltage at the bit line BL0 decreases from ViiC/2.

When the dummy word line DWL0 is selected at time t1 and the voltage at the dummy word line DWL0 increases from the power supply Vss level, the charge of the dummy cell 23a increases the voltage at the bit line BL0 (time t2).

In this state, the cell capacitance value of the dummy cell 23a is set so that the increased voltage at the bit line BL0 is recognized as a low level by the sense amplifier 20a.

When the sense amplifier 20a is activated by the sense amplifier activation signal LE (time t3), the sense amplifier 20a amplifies the differential voltage between the bit lines BL0, /BL0, and the bit line BL0 outputs cell information "0".

The voltage at the word line WL0 increases to the predetermined step up voltage Vpp. The step up voltage Vpp re-writes (refreshes) the cell information "1" of the other memory cells.

When increasing the voltage at the word line WL0, the transient time tT is set close to the active time tR of the low strobe signal /RAS, which is a regulated value. During the transient time tT, the word line voltage VWL increases from 10 percent of the maximum amplitude (step up voltage Vpp) to 90 percent of the maximum amplitude.

An example in which cell information "1" is stored in the memory cell 18a will now be discussed with reference to FIG. 7B. The cell storage voltage Vst of the memory cell 18a is equal to the cell voltage ViiC, which corresponds to cell information "1".

The bit lines BL0, /BL0 are precharged to voltage ViiC/2 prior to the reading of the cell information "1". The voltages at the dummy word lines DWL0, DWL1 are reset to the low power supply voltage Vss.

Then, the voltage at the word line WL0 selected by the row address signal RA is increased (time t0). When the voltage at the word line WL0 is increased from the low power supply voltage Vss by the threshold value voltage Vthcell (time t1), the voltage VWDL0 at the dummy word line DWL0 is increased to the low power supply voltage Vss. As the dummy word line voltage VWDL0 increases, the charge of the dummy cell 23a increases the voltage at the bit line BL0 (time t2).

In this state, the cell capacitance value of the dummy cell 23a is set so that the increased voltage at the bit line BL0 is recognized as a high level by the sense amplifier 20a.

Then, when the sense amplifier 20a is activated by the sense amplifier activation signal LE (time t3), the sense amplifier 20a amplifies the differential voltage between the bit lines BL0, /BL0, and the bit line BL0 outputs cell information "1".

The voltage at the word line WL0 increases to the predetermined step up voltage Vpp. The step up voltage Vpp refreshes (re-writes) the cell information "1".

Normally, when the word line voltage VWL0 increases from the precehage voltage (ViiC/2) by the threshold voltage Vthcell (time t4), the cell information "1" of the memory cell 18a is read to the bit line BL0. However, at time t2, which is prior to time t4, the charge of the dummy cell 23a during activation of the dummy word line DWL0 increases the voltage at the bit line BL0. The increase in the voltage at the bit line BL0 by the dummy cell 23a is equivalent to providing the bit line BL0 with cell information "1".

Thus, the time from when the voltage at the word line WL0 is increased (time t0) to when the sense amplifier 20a is activated (time t3) is reduced. In other words, the read cycle time is reduced. As a result, the access time (tRAC) from when the read command is received to when data is output is reduced.

When reading the cell information of the memory cell 18b, the activation of the dummy word line DWL1 and the activation of the sense amplifier 20a are performed at the same timing as when reading the cell information of the memory cell 18a. Thus, the same effects are obtained. Further, the same applies when reading the cell information of the memory cells 19a, 19b.

The refresh interval will now be discussed.

Figure 8A:
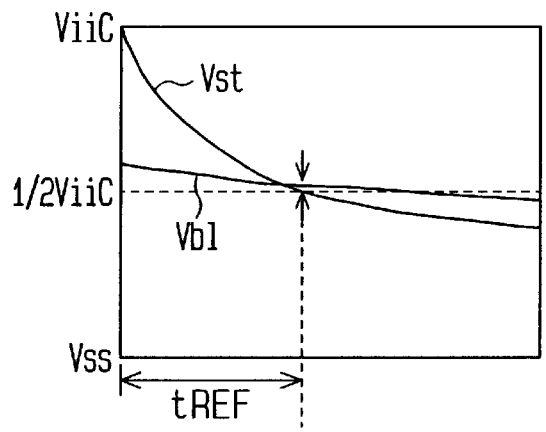
FIGS. 8A and 8B are waveform charts each showing a relationship between a cell storage voltage and a bit line voltage.
Figure 8B:
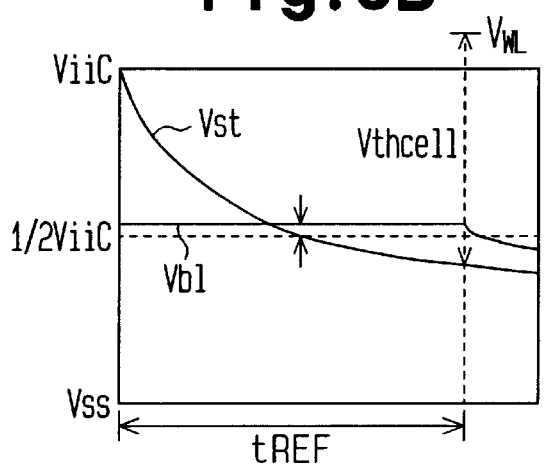

FIGS. 8A and 8B are charts showing the waveforms of the cell storage voltage Vst and the bit line voltage Vb1, which is increased by a dummy cell when reading cell information "1". FIG. 8A represents a prior art SDRAM, and FIG. 8B represents the SDRAM 10 of the first embodiment.

As shown in FIG. 8A, in the prior art SDRAM, the cell storage voltage Vst decreases at a predetermined rate in accordance with the elapsed time after the refreshing. The bit line voltage Vb1 increased by a dummy cell also decreases as time elapses.

When the differential voltage between the bit line voltage Vb1 and the bit line voltage at which cell information is not read (precharge voltage Vpr=ViiC/2) is less than or equal to the sensitivity of the sense amplifier, the sense amplifier cannot amplify the bit line voltage. Accordingly, the time from when the cell information "1" is written to when the differential voltage becomes less than or equal to the sensitivity of the sense amplifier corresponds to a cell charge holding time. The refresh interval tREF is set in accordance with the cell charge holding time.

As shown in FIG. 8B, in the SDRAM 10, the cell storage voltage Vst decreases in the same manner as the prior art. However, in the SDRAM 10, the bit line voltage Vb1 is increased by a dummy cell at a stage when cell information is not read to the bit line. Thus, the differential voltage between a pair of bit lines is held at a level that is greater than or equal to the sensitivity of the sense amplifier even if the cell storage voltage Vst becomes less than or equal to the precharge voltage Vpr (ViiC/2). As a result, the refresh interval tREF is set longer than that in the prior art.

The cell transistor Tr is an n-channel MOS transistor. Thus, when the cell storage voltage Vst is higher than the precharge voltage Vpr, the storage node Nst functions as the drain of the cell transistor Tr. When the cell storage voltage Vst is lower than the precharge voltage Vpr, the storage node Nst functions as the source of the cell transistor Tr.

When the cell storage voltage Vst decreases from the word line voltage VWL by the threshold value voltage Vthcell, the cell transistor Tr is activated. If the cell storage voltage Vst is lower than the bit line precharge voltage Vpr (ViiC/2) in this state, the memory cell decreases the bit line voltage via the cell transistor Tr. This state is equivalent to when cell information "1" is read from the memory cell. Accordingly, the refresh interval tREF is the time from when cell information "1" is written to when the cell storage voltage Vst decreases from the word line voltage VWL by a predetermined threshold value voltage Vthcell.

It is preferred that the word line voltage VWL that activates the sense amplifier be as slow as possible (be increased gradually) to prolong the refresh internal tREF. However, if the word line voltage VWL is too low, it takes too long to obtain the predetermined bit line differential voltage when reading the cell information "0". Accordingly, the word line voltage VWL when activating the sense amplifier is determined based on the cell information read speed (the time from when the word line goes high to when the sense amplifier is activated) and the refresh interval.

Cell information "0" of the memory cell is read to the bit line when the word line voltage VWL increases from the low power supply voltage Vss by the threshold value voltage Vthcell. Accordingly, the word line voltage VWL during activation of the sense amplifier that effectively prolongs the refresh interval tREF is greater than or equal to Vss+Vthcell and less than ViiC/2+Vthcell.

The waveform of the word line voltage and reduction of the chip size will now be discussed.

Figure 9:
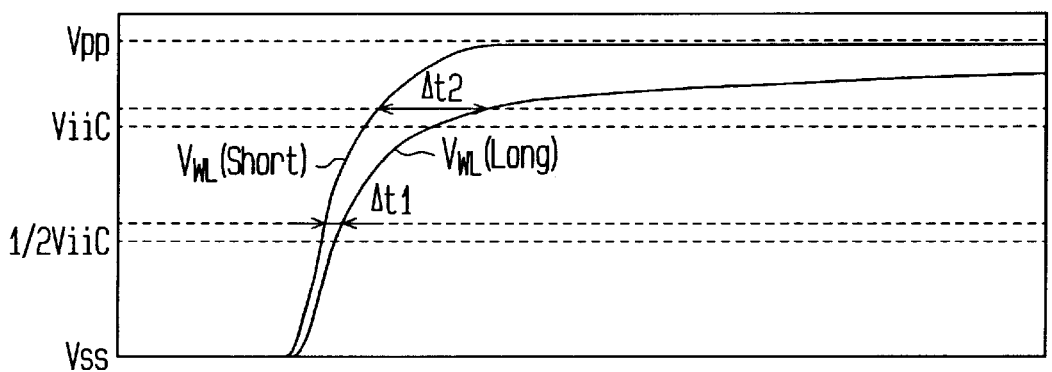
FIG. 9 is a waveform chart of the word line voltage of the semiconductor memory device of FIG. 3.

FIG. 9 is a waveform chart of the word line voltage VWL.

The waveform of the word line voltage VWL is determined by the time constant (parasitic resistance and parasitic capacitance) of the word line. The word line voltage VWL increases more gradually when the word line is long in comparison to when the word line is short.

In the SDRAM 10, a state equivalent to when cell information "1" is read to the bit line is produced earlier than when the cell information "1" is read to the bit line in the prior art. In other words, the equivalent state is produced at timing t1 (FIG. 7B) when the word line voltage VWL increases from the lower power supply voltage Vss by the threshold value Vthcell.

In FIG. 9, a timing difference Δt1, which is affected by the length of the word line, is shorter than a difference Δt2, which occurs when cell information "1" is read. The timing difference is the delay of the timing when the word line is long from the timing when the word line is short.

Accordingly, when using the reading method of the first embodiment, cell information is read at substantially the same timing as in the prior art (the word line being short) even if the word line is long. Thus, the length of the word line that drives a single sub-word decoder may be increased in comparison to that of the prior art. As a result, the number of sub-word decoders is decreased.

Figure 10A:
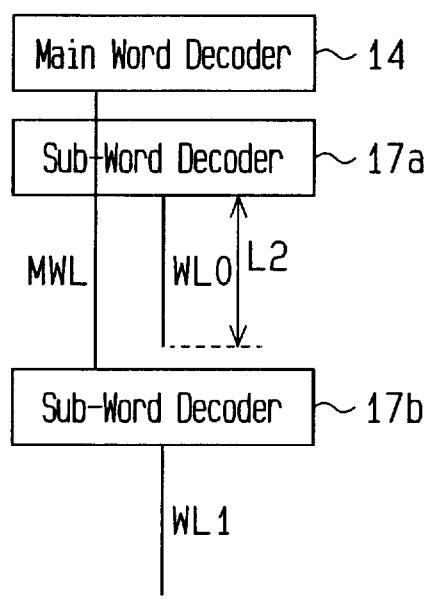
FIGS. 10A and 10B are explanatory diagrams each showing a relationship between a word line and a sub-word line.
Figure 10B:
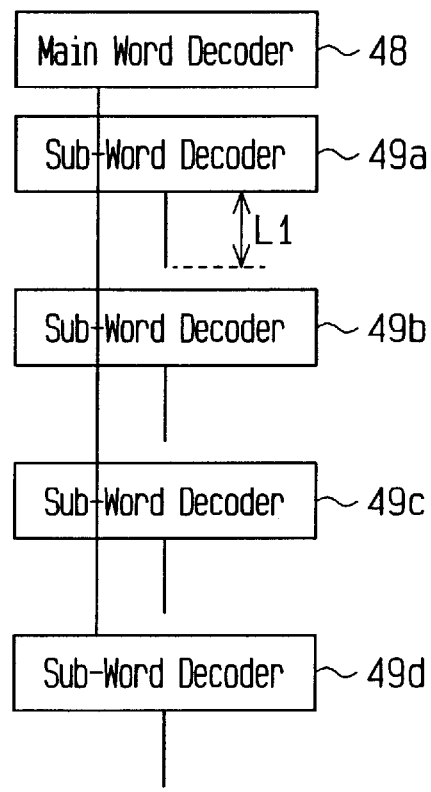

FIG. 10A is an explanatory view showing the relationship between the main word line and the sub-word line in the first embodiment. FIG. 10B is an explanatory view showing the relationship between the main word line and the sub-word line in the prior art.

As shown in FIG. 10B, in the prior art example, four sub-word decoders 49a, 49b, 49c, 49d are connected to a main word line MWL. Each sub-word decoder 49a–49d drives a word line having length L1.

As shown in FIG. 10A, presuming that the sub-word decoders 17a, 17b drive a word line having length L2 (2×L1), which is two times length L2, the word line is driven by two sub-word decoders. Thus, the area required for the sub-word decoder decreases to ½ of that of the prior art. As a result, the chip size of the SDRAM 10 decreases.

Further, since the length of the main word line MWL decreases, the load applied to the main decoder 14 decreases. As a result, the driver size decreases, and the current consumption decreases.

The SDRAM 10 of the first embodiment has the advantages described below.

(1) The dummy word lines DWL0, DWL1 are activated when the word line voltage VWL increases to the voltage (Vthcell) that enables the reading of cell information "0" from the memory cells 18a–19b (t1). The voltage at the bit lines BL0, /BL0, BL1, /BL1 is increased by the dummy cells 23a–24b connected to the dummy word lines. As a result, the sense amplifiers 20a, 20b are activated earlier than in the prior art, and the cycle time for reading cell information is shortened.

(2) The dummy cells 23a–24b increase the voltage at the bit lines BL0, /BL, BL1, /BL1 before the memory cells 18a–19b provide the bit lines with cell information "1". Thus, the sense amplifiers 20a, 20b are activated earlier and cell information "1" is output earlier than in the prior art. This reduces the cycle time.

The rising delay of the word line voltage VWL, which is caused by the word line length, is compensated for by the shortened cycle time. Thus, the word line length may be increased by a predetermined amount. As a result, the number of sub-word decoders for driving the word line is decreased, and the chip size of the SDRAM is decreased.

(3) The sense amplifiers 20a, 20b are activated earlier than in the prior art. This amplifies the bit line voltage earlier in comparison to the prior art and reduces the time from when the voltage at the word lines WL0, WL1 increases to when the switch circuits 22a, 22b connect the bit lines BL0, /BL0, BL1, /BL1 to the data bus lines DB, /DB.

(4) The dummy cells 23a–24b provide the bit lines BL0, /BL0, BL1, /BL1 with cell information "1" in an equivalent manner. This ensures that the sense amplifiers 20a, 20b amplify the differential voltage of the bit lines BL0, /BL0 or the differential voltage of the bit lines bL1, /BL1 even if the cell storage voltage Vst of the memory cells 18a–19b decreases to a value less than or equal to the bit line precharge voltage. As a result, the refresh interval is increased and the power consumption is decreased.

Figure 11:
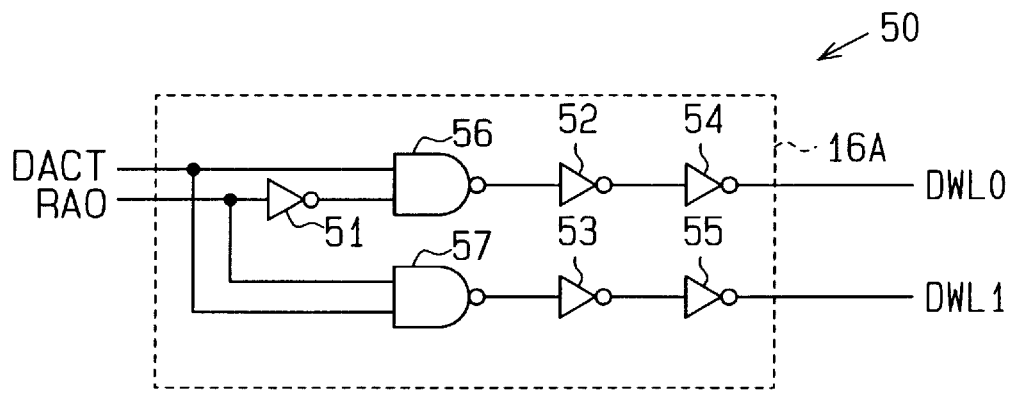
FIG. 11 is a schematic partial block diagram of a semiconductor memory device according to a second embodiment of the present invention.

FIG. 11 is a schematic circuit block diagram of a dummy word driver 16A of a semiconductor memory device (SDRAM) 50 according to a second embodiment of the present invention. The SDRAM 50 differs from the SDRAM 10 in only the dummy word driver. The dummy word driver 16A is used in lieu of the dummy word driver 16 of FIG. 3.

The dummy word driver 16A includes first to fifth inverter circuits 51–55, a first NAND circuit 56, and a second NAND circuit 57. The first NAND circuit 56 receives the dummy word activation signal DACT and the address signal RA0, which has been inverted by the first inverter circuit 51. The second NAND circuit 57 receives the dummy word activation signal DACT and the address signal RA0.

The output terminal of the first NAND circuit 56 is connected to the first dummy word line DWL0 via the second and third inverter circuits 52, 53, which are connected in series. The output terminal of the second NAND circuit 57 is connected to the second dummy word line DLW1 via the fourth and fifth inverter circuits 54, 55. The dummy word driver 16A receives the high power supply voltage Vii and the low power supply voltage Vss.

The dummy word driver 16A selects the first or second dummy word line DWL0, DEL1 based on the address signal RA0. The dummy word selection is performed to drive the bit line, which is not connected to the memory cell that reads the cell information. The dummy word driver 16A decreases the voltage of the first or second dummy word line DWL0, DLW1 from the high power supply voltage Vii to the low power supply voltage Vss when activated by the dummy word activation signal DACT.

Figure 12:
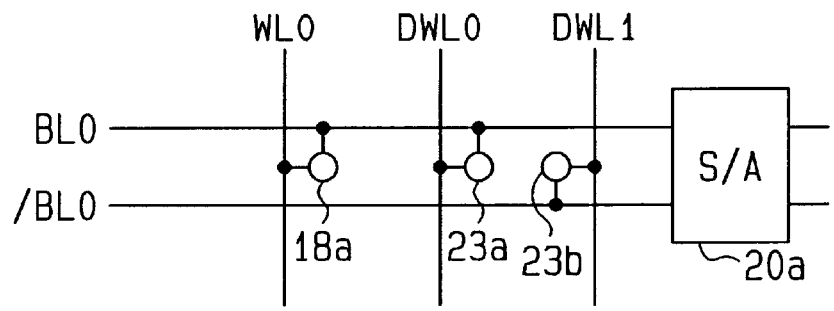
FIG. 12 is a partial block circuit diagram of the semiconductor memory device of FIG. 11.

As an example, when the cell information of the memory cell 18a shown in FIG. 12 is read, the dummy word driver 16A selects the second dummy word line DWL1 to drive the inverting bit line /BL0. The dummy word driver 16A decreases the voltage of the second dummy word line DLW1 from the high power supply voltage Vii to the low power supply voltage Vss when activated by the dummy word activation signal DACT.

Figure 13A:
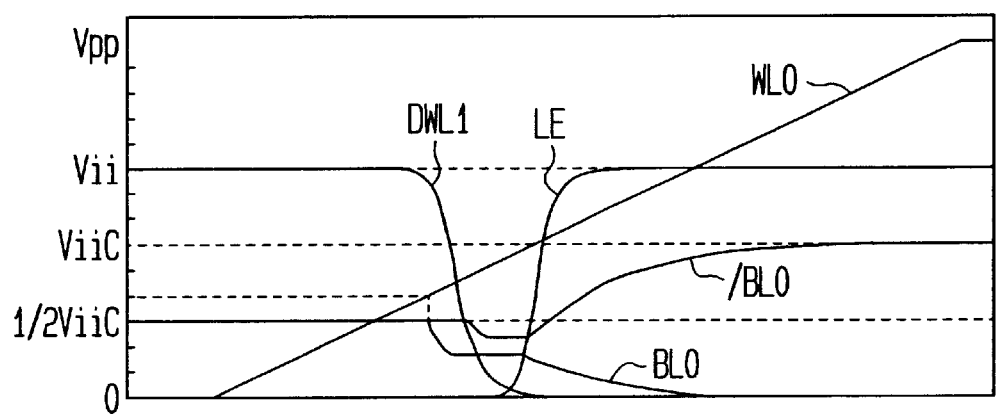
FIGS. 13A and 13B are charts showing the waveforms of the semiconductor memory device of FIG. 11.
Figure 13B:
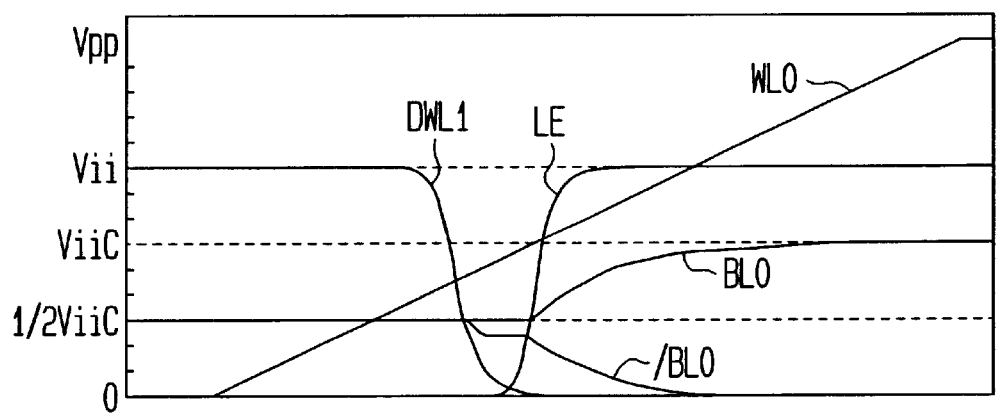

The operation of the SDRAM (dummy word driver 16A) will now be discussed with reference to FIGS. 13A and 13B. FIG. 13A is a waveform diagram showing the operation of the SDRAM 50 when cell information "0" is read from the memory cell 18a. FIG. 13B is a waveform diagram showing the operation of the SDRAM 50 when cell information "1" is read from the memory cell 18a.

When cell information "0" is read from the memory cell 18a, as shown in FIG. 13A, the first word line WL0 is activated and the voltage at the first bit line BL0 is decreased. When the dummy word driver 16A activates the second dummy word line DWL1, the charge of the dummy cell 23b decreases the voltage of the first inverting bit line /BL0.

When cell information "1" is read from the memory cell 18a, as shown in FIG. 13B, the dummy word driver 16A activates the second dummy word line DWL1 of the first word line voltage VWL0 is less than or equal to ViiC/2+Vthcell. As a result, the charge of the dummy cell 23b decreases the voltage at the inverting bit line /BL0. This produces a differential voltage corresponding to the differential voltage shown in FIG. 7B between the bit lines BL0, /BL0.

The SDRAM 50 of the second embodiment SDRAM 50 has the advantage described below.

When cell information is read to the bit line from the memory cell, the voltage of the bit line to which the cell information is not read is decreased by the charge of a dummy cell. Thus, when reading cell information "1", a predetermined differential voltage between a pair of bit lines is generated if the voltage of the word line connected to the memory cell which reads information is low. In this state, the sense amplifier 20a is activated earlier than in the prior art and the cell information is output early. As a result, this shortens the cycle time.

Figure 14:
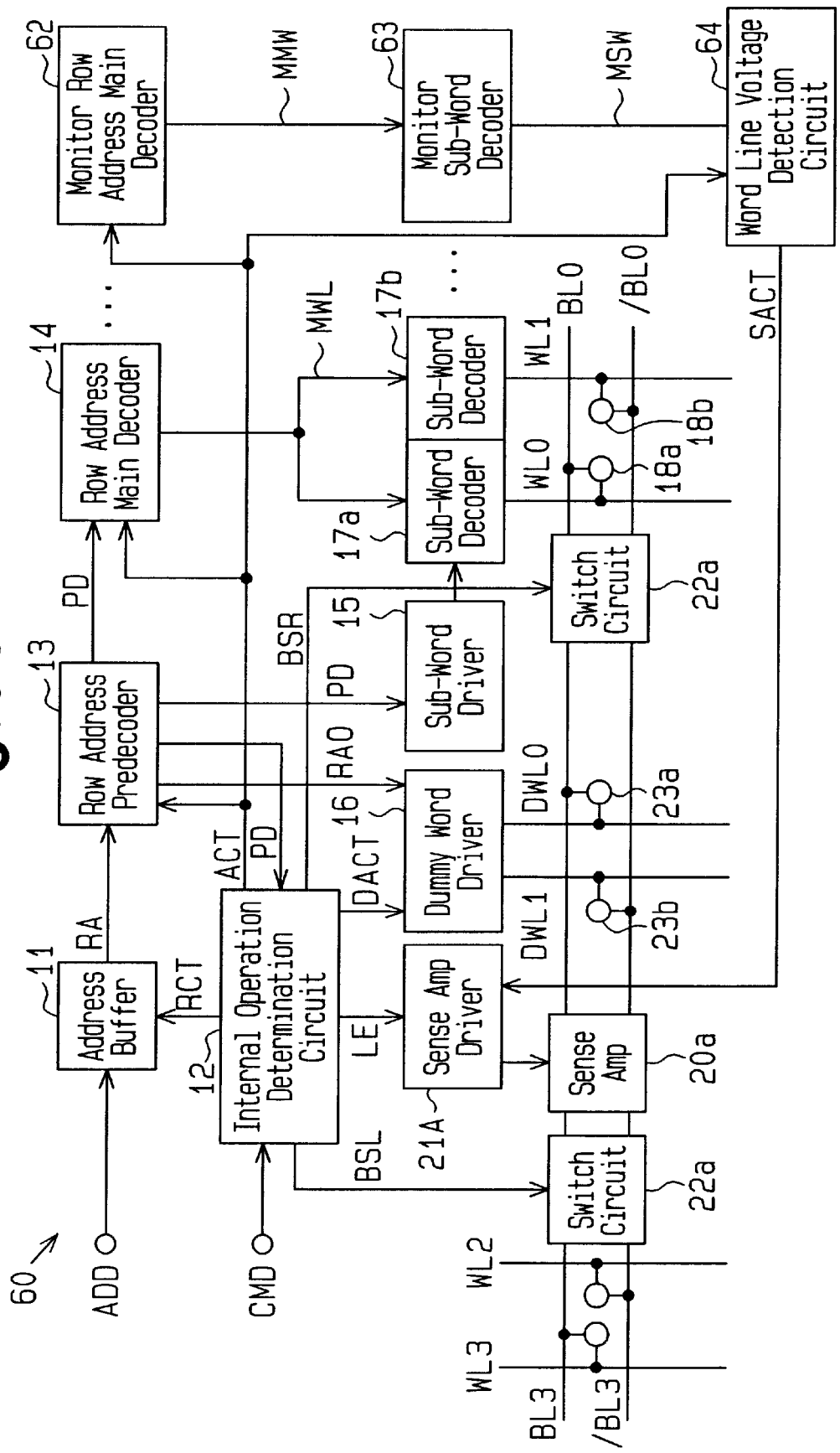
FIG. 14 is a schematic block diagram of a semiconductor memory device according to a third embodiment of the present invention.

FIG. 14 is a schematic block circuit diagram of a semiconductor memory device (SDRAM) 60 according to a third embodiment of the present invention. In the SDRAM 60 of the third embodiment, the sense amplifier driver 21 of the first embodiment is replaced by a sense amplifier driver 21A. In addition to the configuration of the SDRAM 10, the SDRAM 60 includes a monitor row address main decoder 62, a monitor sub-word decoder 63, and a word line voltage detection circuit 64.

The monitor row address main decoder 62 and the word line voltage detection circuit 64 receive the activation signal ACT from the internal operation determination circuit 12.

A monitor main word line MMW is connected to the monitor row address main decoder 62. The monitor row address main decoder 62 activates the monitor main word line MMW based on the activation signal ACT.

The monitor main word line MMW is connected to the monitor sub-word decoder 63, which is connected to a monitor sub-word line MSW. When the monitor main word line MMW is activated, the monitor sub-word decoder 63 activates the monitor sub-word line MSW.

The monitor sub-word decoder 63 has the same electric characteristic as the sub-word decoders 17a, 17b. The monitor sub-word line MSW has the same electric characteristic (parasitic resistance, parasitic capacitance) as the normal word lines WL0, WL1 that are connected to a memory cell. Accordingly, the voltage VMSW at the monitor sub-word line MSW, which is activated by the monitor sub-word decoder 63 varies in the same manner as at the word lines WL0, WL1.

The monitor sub-word line MSW is connected to the word line voltage detection circuit 64. The word line voltage detection circuit 64 detects the monitor sub-word line voltage VMSW and activates a second sense amplifier activation SACT when the monitor word line voltage VMSW increases to a value that is greater than or equal to a monitor voltage Vmon.

The monitor voltage Vmon is set in accordance with the timing at which the sense amplifier 20a is activated. In the third embodiment, the monitor voltage Vmon is set at voltage ViiC/2+Vthcel, which is higher than the precharge voltage Vpr (ViiC/2) by the threshold value Vthcell.

The word line voltage detection circuit 64 generates the second sense amplifier activation signal SACT at a low level when the monitor sub-word line voltage VMSW is lower than the monitor voltage Vmon. The word line voltage detection circuit 64 generates the second sense amplifier activation signal SACT at a high level when the monitor sub-word line voltage VMSW increases to a value greater than or equal to the monitor voltage Vmon.

The sense amplifier driver 21A generates predetermined activation voltages SAP, SAN when the sense amplifier activation signal LE and the sense amplifier activation signal SACT are both high. The activation voltages SAP, SAN are supplied to the sense amplifier 20a. The sense amplifier 20a amplifies the differential voltage between the bit lines BL0, /BL0 based on the activation voltages SAP, SAN.

The monitor sub-word line voltage VMSW varies in the same manner as the voltages at the words lines WL0, WL1. Accordingly, the sense amplifier 20a is activated when the voltage at the word lines WL0, WL1 becomes equal to or greater than the monitor voltage Vmon.

The voltage change at the word lines is affected by voltage and temperature conditions. Accordingly, by detecting the voltage change at the word lines WL0, WL1 (actually, the monitor word line MSW), the sense amplifier 20a is activated at a timing that is optimal for refreshing at the voltage of the word lines WL0, WL1.

Figure 15:
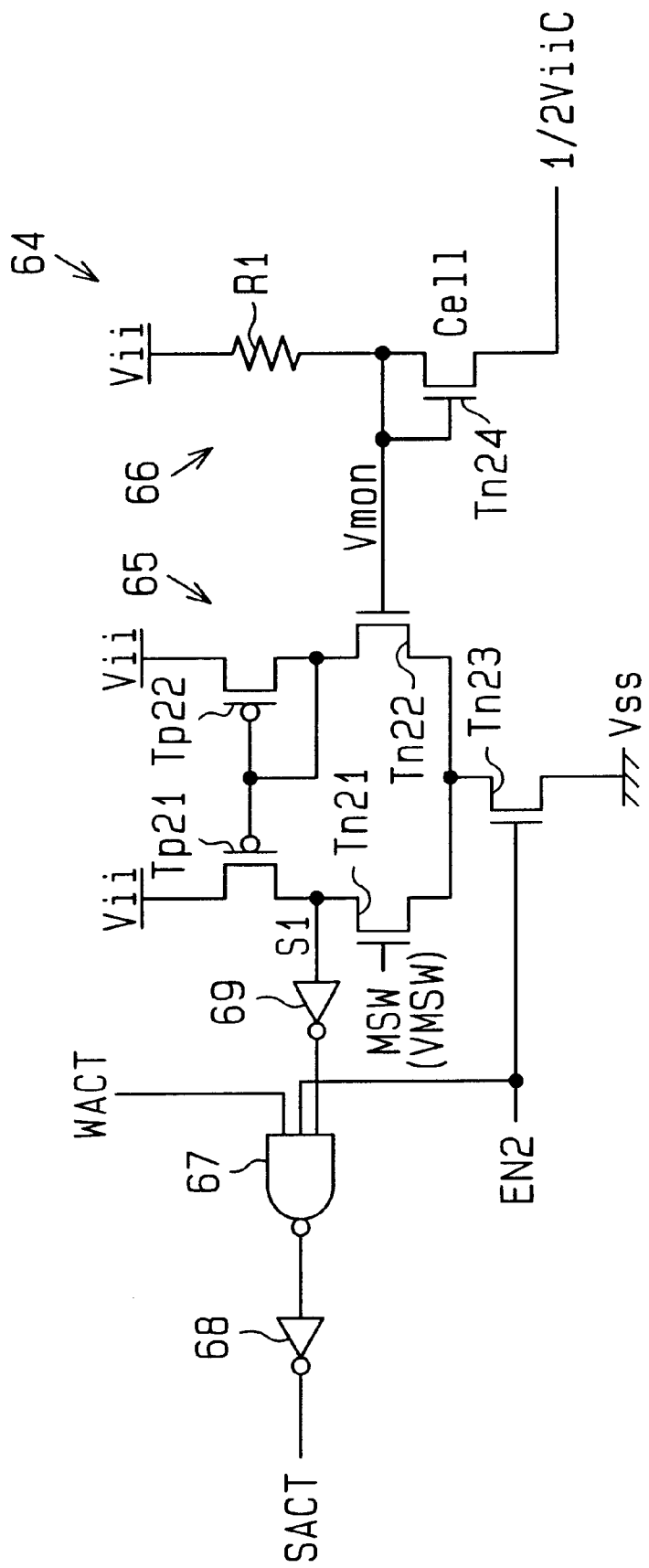
FIG. 15 is a schematic circuit diagram of a word line voltage detection circuit of the semiconductor memory device of FIG. 14.

FIG. 15 is a schematic circuit diagram of the word line voltage detection circuit 64. The word line voltage detection circuit 64 includes a differential amplification circuit 65, a monitor voltage generation circuit 66, a NAND circuit 67, and an inverter circuit 68.

The monitor sub-word line MSW is connected to the differential amplification circuit 65. The differential amplification circuit 65 includes p-channel MOS transistors Tp21, Tp22 and n-channel MOS transistors Tn21, Tn22, Tn23. The sources of the p-channel MOS transistors Tp21, Tp22 each receive the high potential power supply voltage Vii. The drain of the transistor Tp21 is connected to the drain of the NMOS transistor Tn21, and the drain of the transistor Tp22 is connected to the drain of the NMOS transistor Tn22. The gate of the PMOS transistor Tp21 is connected to the gate and drain of the PMOS transistor Tp21.

The gate of the NMOS transistor Tn21 is connected to the monitor sub word line MSW. The gate of the NMOS transistor Tn22 is connected to the monitor voltage generation circuit 66. The sources of the NMOS transistors Tn21, Tn22 are connected together. A node between the NMOS transistors Tn21, Tn22 is connected to the drain of the NMOS transistor Tn23.

The gate of the NMOS transistor Tn23 receives an activation signal EN2, and the source of the transistor Tn23 receives the low power supply voltage Vss.

The monitor voltage generation circuit 66 includes a resistor R1 and an n-channel MOS transistor (monitor transistor) Tn24. The resistor R1 is connected between the high voltage power supply Vii and the drain of the NMOS transistor Tn24. The drain and gate of the NMOS transistor Tn24 are connected to each other. The drain of the NMOS transistor Tn24 is also connected to a differential amplification circuit 65. The source of the transistor Tn24 receives the precharge voltage Vpr (ViiC/2).

The NMOS transistor Tn24 has the same form and electric characteristics as the cell transistors Tr of the memory cells 18a, 18b. Accordingly, the drain voltage of the NMOS transistor Tn24 is higher than the precharge voltage Vpr (ViiC/2) by the threshold value voltage Vthcell. The drain voltage of the transistor Tn24 is the monitor voltage Vmon. The monitor voltage Vmon is supplied to the differential amplification circuit 65.

When the activation signal EN2 goes high and activates the differential amplification circuit 65, the differential amplification circuit 65 amplifies the differential voltage between the monitor sub-word line voltage Vmsw and the monitor voltage Vmon to generate a detection signal S1. The detection signal S1 is provided to a first input terminal of the NAND circuit 67 from the drain of the NMOS transistor Tn21 via an inverter circuit 69. The detection signal S1 goes high when the monitor sub-word line voltage Vmsw is lower than the monitor voltage Vmon and goes low when the monitor sub-word line voltage Vmsw is greater than or equal to the monitor voltage Vmon.

The NAND circuit 67 has a second input terminal to receive the activation signal EN2 and a third input terminal to receive a word line activation signal WACT. The output terminal of the NAND circuit 67 is connected to the input terminal of the inverter circuit 68. The inverter circuit 68 outputs the second sense amplifier activation signal SACT.

The word line voltage detection circuit 64 generates the second amplifier activation signal SACT based on the detection signal S1 of the differential amplification circuit 65 when the activation signal EN2 and the word line activation signal WACT are high.

The SDRAM 60 of the third embodiment has the advantages described below.

The word line voltage detection circuit 64 of the SDRAM 60 generates the second sense amplifier activation signal SACT when the monitor sub-word line voltage Vmsw reaches the monitor voltage Vmon (Viic/2+Vthcell) and provides the signal SACT to the sense amplifier driver 21A. Thus, the sense amplifier 20a is activated when the voltages at the word lines WL0, WL1 substantially reaches ViiC/2+Vthcell.

The third embodiment may be modified as described below.

The NAND circuit 67 of the word line voltage detection circuit 64 may generate the sense amplifier activation signal SACT based on the activation signal EN2 and the detection signal without using the word line activation signal WACT. In this case, the NAND circuit 67 of the word line voltage detection circuit 64 needs only two terminals.

The NMOS transistor Tn23 of the word line voltage detection circuit 64 may be activated by the high power supply voltage Vii.

Figure 16:
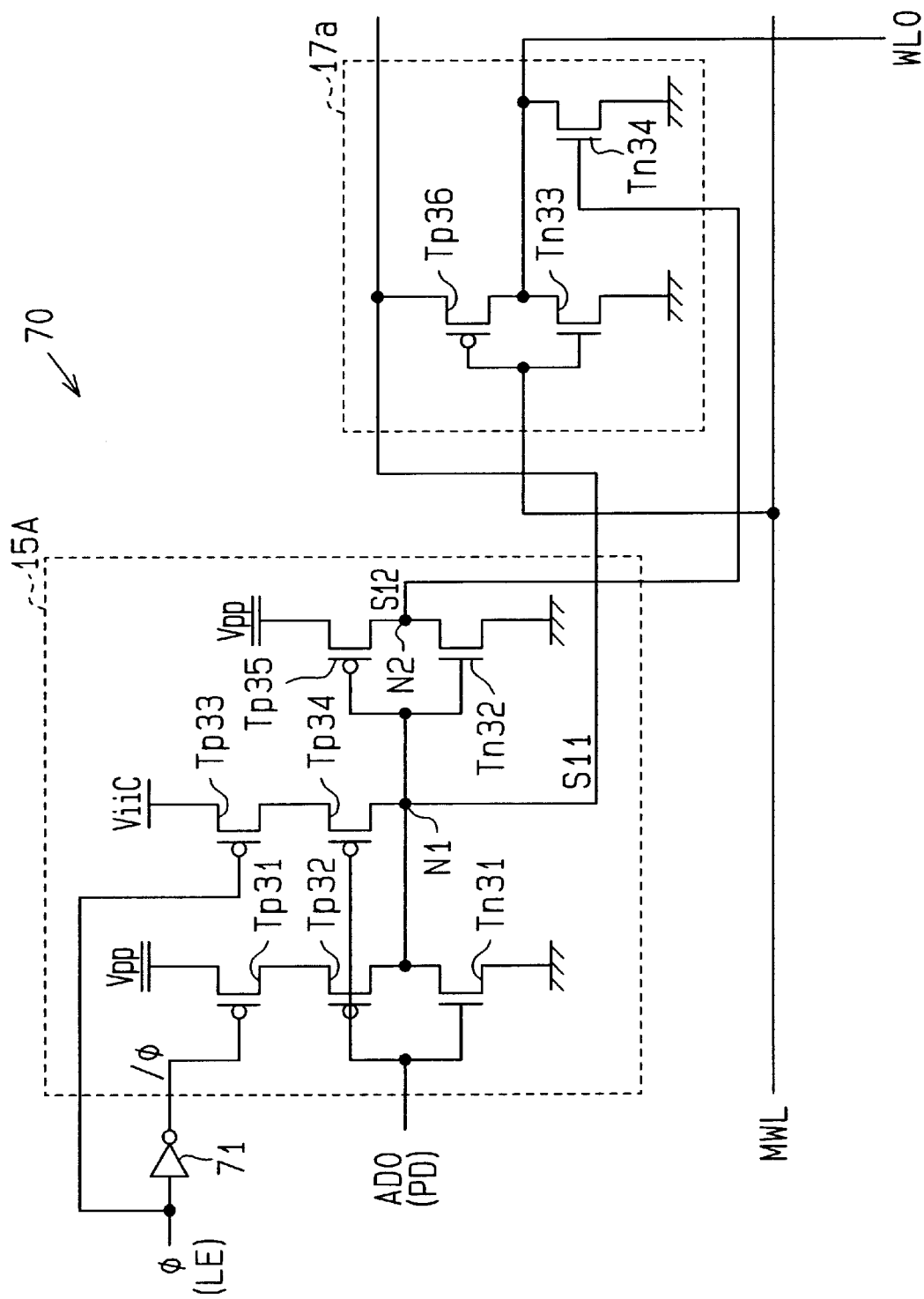
FIG. 16 is a circuit diagram of a sub word driver of a semiconductor memory device according to a fourth embodiment of the present invention.

FIG. 16 is a circuit diagram of a sub-word driver 15A of a semiconductor memory device (DRAM) 70 according to a fourth embodiment of the present invention. The DRAM 70 of the fourth embodiment differs from the DRAM 50 of FIG. 3 only in the sub-word driver 15A.

The sub-word driver 15A receives the address signal AD0. The address signal AD0 includes the predecode signal PD decoded by the row address predecoder 13. The sub-word driver 15A includes a voltage switching signal Ø and an inverted switching signal /Ø generated by the inverter circuit 71.

The voltage switching signal Ø is a shifting signal of the sense amplifier activation signal LE or a shifting signal subsequent to the sense amplifier activation signal LE. The shifting signal is a signal that shifts subsequent to when the sense amplifier activation signal LE activates a sense amplifier, and includes, for example, a column selection signal, a cell precharge signal, or a signal generated by delaying the sense amplifier activation signal LE. In the fourth embodiment, the sense amplifier activation signal LE is used.

The sub-word driver 15A includes first to fifth p-channel MOS transistors Tp31–Tp35 and first and second n-channel MOS transistors Tn31, Tn32. The source of the first PMOS transistor Tp31 receives the step up voltage Vpp and the gate of the first PMOS transistor Tp31 receives the inverting switching signal /Ø. The drain of the transistor Tp31 is connected to the source of the second PMOS transistor Tp32.

The gate of the second PMOS transistor Tp32 receives the address signal AD0, and the drain of the second PMOS transistor Tp32 is connected to the drain of the first NMOS transistor Tn31. The gate of the first NMOS transistor Tn31 receives the address signal AD0, and the source of the first NMOS transistor receives the low power supply voltage Vss.

The source of the third PMOS transistor Tp33 receives the cell voltage ViiC, and the gate of the third PMOS transistor Tp33 receives the voltage switching signal Ø. The drain of the transistor Tp33 is connected to the source of the fourth PMOS transistor Tp34. The gate of the fourth PMOS transistor Tp34 receives the address signal AD0. The drain of the transistor Tp34 is connected to a node between the drain of the second PMOS transistor Tp32 and the drain of the first NMOS transistor Tn31 and to a node between the gate of the fifth PMOS transistor Tp35 and the gate of the second NMOS transistor Tn32.

The source of the fifth PMOS transistor Tp35 receives the step up voltage Vpp, and the drain of the fifth PMOS transistor Tp35 is connected to the drain of the second NMOS transistor Tn32. The source of the second NMOS transistor Tn32 receives the low power supply voltage Vss.

The first NOS transistor Tn31, the second PMOS transistor Tp32, and the first NMOS transistor Tn31 generate a first drive signal S11. The first drive signal S11 is provided to the sub-word decoder 17a from node N1, which is connected to the drain of the transistor Tp32 and the drain of the transistor Tn31.

The fifth PMOS transistor Tp35 and the second NMOS transistor Tn32 generate a second drive signal S12. The second drive signal S12 is provided to the sub-word decoder 17a from node N2, which is connected to the drain of the fifth PMOS transistor Tp35 and the drain of the second NMOS transistor Tn32.

The step up voltage Vpp is higher than the cell power supply ViiC by the threshold value voltage Vthcell. The cell power supply ViiC is lower than the sum of the precharge voltage Vpr (ViiC/2) and the threshold voltage Vthcell.

When the voltage switching signal Ø is low (the inverted switching signal /Ø being high), the first PMOS transistor Tp31 is inactivated and the third PMOS transistor Tp33 is activated. The source of the fourth PMOS transistor Tp34 is supplied with the cell power supply ViiC via the third transistor Tp33. The fourth PMOS transistor Tp34 and the first NMOS transistor Tn31 form an inverter circuit. The inverter circuit inverts the address signal AD0 and generates the first drive signal S11. The first drive signal S11 has the cell voltage ViiC or the low power supply voltage Vss.

When the voltage switching signal Ø is high (the inverted switching signal /Ø being low), the first PMOS transistor Tp31 is activated and the third PMOS transistor Tp33 is inactivated. The source of the second PMOS transistor Tp32 is supplied with the step up voltage Vpp via the first transistor Tp31. The second PMOS transistor Tp32 and the first NMOS transistor Tn31 form an inverter circuit. The inverter circuit inverts the address signal AD0 and generates the first drive signal S11. In this case, the first drive signal S11 has the step up voltage Vpp or the low power supply voltage Vss.

Accordingly, when the address signal AD0 is high, the sub-word driver 15A provides the sub-word decoder 17a with the first drive signal S11, which has the low power supply voltage Vss. When the address signal AD0 is low, the sub-word driver 15A provides the sub-word decoder 17a with the first drive signal S11, which has the cell voltage ViiC or the step-up voltage Vpp, based on the voltage switching signal Ø (inverted switching signal /Ø).

When the address signal AD0 is high, the sub-word driver 15A provides the sub-word decoder 17a with the second drive signal S12, which has the step up voltage Vpp. When the address signal AD0 is low, the sub-word driver 15A provides the sub-word decoder 17a with the second drive signal S12, which has the low power supply voltage Vss.

The sub-word decoder 17a includes a p-channel MOS transistor Tp36 and first and second n-channel MOS transistors Tn33, Tn34. The source of the PMOS transistor Tp36 is connected to node N1 of the sub-word driver 15A to receive a first drive signal S11. The drain of the transistor Tp36 is connected to the drain of the first NMOS transistor Tn33. The source of the first NMOS transistor Tn33 receives the low power supply voltage Vss.

The gates of the PMOS transistor Tp36 and the NMOS transistor Tn33 are connected to each other. A node between the gates of the PMOS transistor Tp36 and the NMOS transistor Tn33 is connected to a main word line MWL. The drains of the PMOS transistor Tp36 and the NMOS transistor Tn33 are connected to each other. A node between the drains of the PMOS transistor Tp36 and the NMOS transistor Tn33 is connected to the drain of the second NMOS transistor Tn34 and the word line WL0.

The gate of the second NMOS transistor Tn34 is connected to node N2 of the sub-word driver 15A to receive the second drive signal S1. The source of the transistor Tn34 receives the lower power supply voltage Vss.

When the main word line MWL has a high level, the PMOS transistor Tp36 is inactivated and the first NMOS transistor Tn33 is activated. In this case, the first NMOS transistor Tn33 connects the word line WL0 to the low voltage power supply. Further, when the address signal AD0 is high, the second NMOS transistor Tn34, which is activated by the address signal AD0, connects the word line WL0 to the low voltage power supply. Accordingly, when the main word line MWL is high or when the address signal AD0 is high, the voltage at the word line WL0 is equal to the low power supply voltage Vss.

When the main word line MWL has a low level and the address signal AD0 is low, the PMOS transistor Tp36 is activated and the first and second NMOS transistors Tn33, Tn34 are both deactivated. In this state, the word line WL0 is provided with the first drive signal S11 (the cell voltage ViiC or the step up voltage Vpp) via the activated PMOS transistor Tp36.

The voltage switching signal Ø (in the fourth embodiment, the sense activation signal LE) is low until the sense amplifier 20a (FIG. 3) is activated. Accordingly, the word line WL0 is sustained at the cell voltage ViiC until the sense amplifier 20a is activated. When the sense amplifier activation signal (voltage switching signal Ø) goes high, the sense amplifier 20a is activated. After the sense amplifier 20a is activated, the voltage at the word line WL0 increases to the step up voltage Vpp.

The sub-word driver 15A provides the sub-word decoder 17a with the first drive signal S11 to increase the voltage of the word line WL0 through two stages. The voltage at the word line WL0 for activating the sense amplifier 20a ranges from the voltage at which data information "0" is read to a bit line pair to a voltage less than a value at which data information "1" is read to the bit line pair.

Figure 17A:
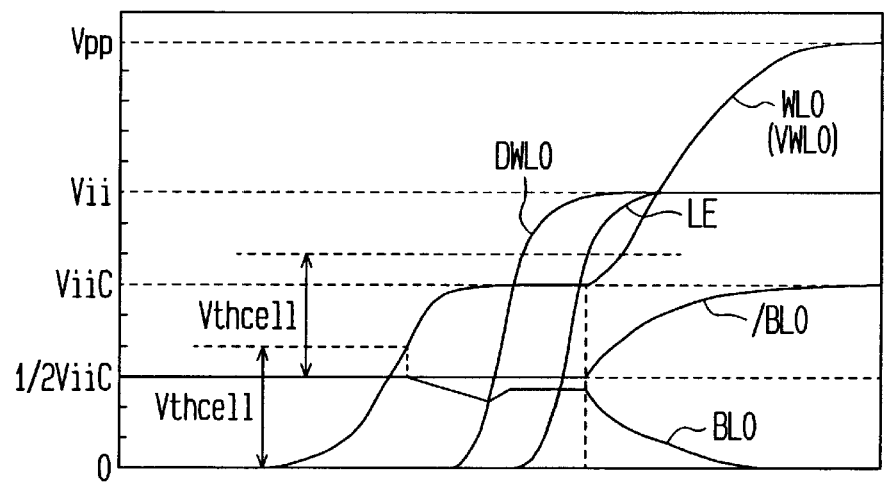
FIGS. 17A and 17B are charts showing the waveforms of the semiconductor memory device of FIG. 16.
Figure 17B:
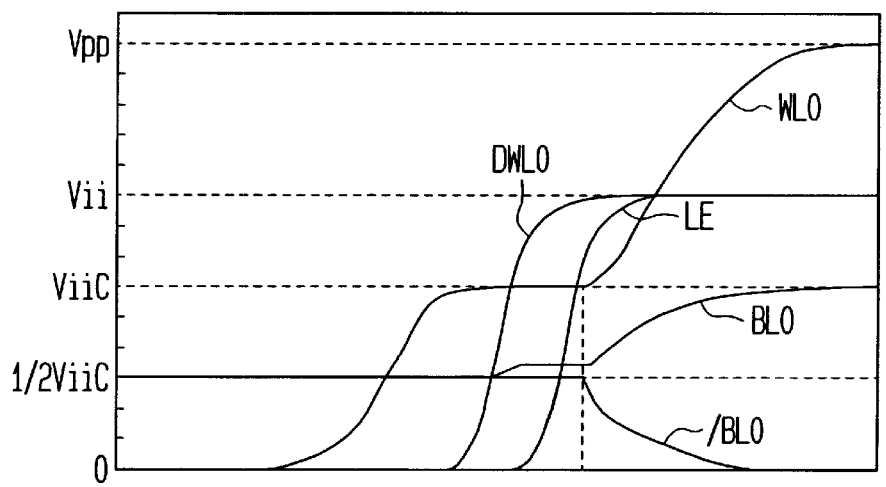

The operation of the SDRAM 70 will now be discussed with reference to FIGS. 17A and 17B. FIG. 17A is a waveform chart illustrating the operation of the SDRAM 70 when reading cell information "0" from the memory cell 18a of FIG. 3. FIG. 17B is a waveform chart illustrating the operation of the SDRAM 70 when data information "1" is read from the memory cell 18a.

An example in which cell information "0" is read will first be discussed. The storage voltage Vst of the memory cell 18a is equal to the low power supply voltage Vss corresponding to cell information "0".

Referring to FIG. 17A, prior to the reading of cell information "0", the bit lines BL0, /BL0 are precharged to voltage Viic/2. The voltage at the dummy word lines DWL0, DWL1 is reset to the low power supply voltage Vss.

The voltage at the word line WL0, which is selected by the row address signal RA, is then increased to the level of the cell voltage ViiC. When the voltage at the word line WL0 increases from the voltage Vss by the threshold value Vthcell, cell information "0" is read from the memory cell 18a. The read cell information "0" decreases the voltage at bit line BL0 from ViiC/2.

In this state, when the dummy word line DWL0 is selected and the voltage at the dummy word line DWL0 increases, the charge of the dummy cell 23a increases the voltage at the bit line BL0. The capacitance value of the dummy cell 23a is set so that the increased voltage at the bit line BL0 is recognized as being at a low level by the sense amplifier 20a in this state.

When the sense amplifier activation signal LE activates the sense amplifier 20a, the sense amplifier 20a amplifies the differential voltage between the bit lines BL0, /BL0 and outputs cell information "0" from the bit line BL0.

The voltage at the word line WL0 is held at the cell voltage ViiC until the sense amplifier 20a is activated and then increased to the level of the step up voltage Vpp. The step up voltage Vpp refreshes the cell information "1" of other memory cells.

An example in which cell information "1" is read will now be discussed. In this case, the storage voltage Vst of the memory cell 18a is equal to the cell voltage Vss corresponding to cell information "1".

Referring to FIG. 17B, prior to the reading of the cell information, the bit lines BL0, /BL0 are precharged to voltage Viic/2. The voltage at the dummy word line DWL0 is reset to the low power supply voltage Vss.

The voltage at the word line WL0, which is selected by the row address signal RA, is then increased to the level of the cell voltage ViiC. The voltage at the dummy word line DWL0 increases from the voltage Vss after the voltage at the word line WL0 increases from the voltage Vss by the threshold value Vthcell.

As the voltage at the dummy word line DWL0 increases, the charge of the dummy cell 23a increases the voltage at the bit line BL0. The capacitance value of the dummy cell 23a is set so that the increased voltage at the bit line BL0 is recognized as being at a high level by the sense amplifier 20a in this state.

When the sense amplifier activation signal LE activates the sense amplifier 20a, the sense amplifier 20a amplifies the differential voltage between the bit lines BL0, /BL0 and outputs cell information "1" from the bit line BL0.

The voltage at word line WL0 is held at the cell voltage ViiC until the sense amplifier 20a is activated and then increased to the level of the step up voltage Vpp. The step up voltage Vpp refreshes the cell information "1" of the memory cell 18a.

The SDRAM 70 of the fourth embodiment has the advantages described below.

(1) When reading cell information from the memory cell 18a, the voltage at the word lines WL0, WL1 is maintained at a predetermined voltage (ViiC). The predetermined voltage is included in a voltage range (greater than or equal to Vthcell to ViiC/2+Vthcell) in which cell information "0" is read to the bit line and cell information "1" is not read. This ensures that the sense amplifier 20a is activated between when the cell information "0" is read to the bit line to when the cell information "1" is read.

(2) When reading cell information from the memory cell 18a, the word line voltage VWL is increased and maintained at the cell voltage ViiC. Then, the word line voltage VWL increases to the step-up voltage Vpp. Thus, in comparison to when the word line voltage VWL increases in a sudden manner from the low power supply voltage Vss to the step up voltage Vpp, the driving capability of the sub-word driver 15A may be decreased and the current consumption required to read cell information decreases.

It should be apparent to those skilled in the art that the present invention may be embodied in many other specific forms without departing from the spirit or scope of the present invention. Particularly, it should be understood that the present invention may be embodied in the following forms.

In the fourth embodiment, the increasing word line voltage VWL may be maintained in the next voltage range.

$$ViiC/2 \leq VWL < ViiC/2 + Vthcell$$

In the first and second embodiments, the timing at which the internal operation determination circuit 12 outputs the activation signal ACT may be set at the same time as the activation of the word line or prior to the activation of the word line.

In each embodiment, the SA activation signal generation circuit 32 may activate the sense amplifier activation signal LE based on the activation signal and at least one of the predecode signal PD and the block selection signal BS. This, for example, shortens the offsetting of signal timings, which is caused by peripheral circuits or wire delays, in comparison to when activating the sense amplifier activation signal LE only with the active signal ACT.

In each embodiment, the sense amplifier may be, for example, a differential sense amplifier.

The present invention may be applied to a semiconductor memory device having connection configurations other than bit lines and sense amplifiers.

Figure 18:
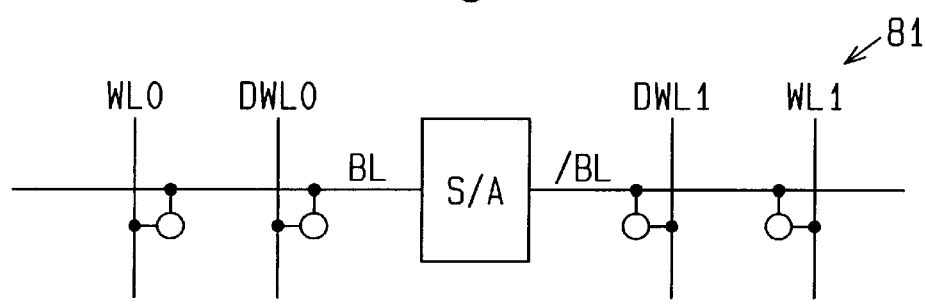
FIG. 18 is a partial block diagram of a semiconductor memory device according to a further embodiment of the present invention.

For example, as shown in FIG. 18, the present invention may be applied to an open bit line SDRAM 81.

Figure 19:
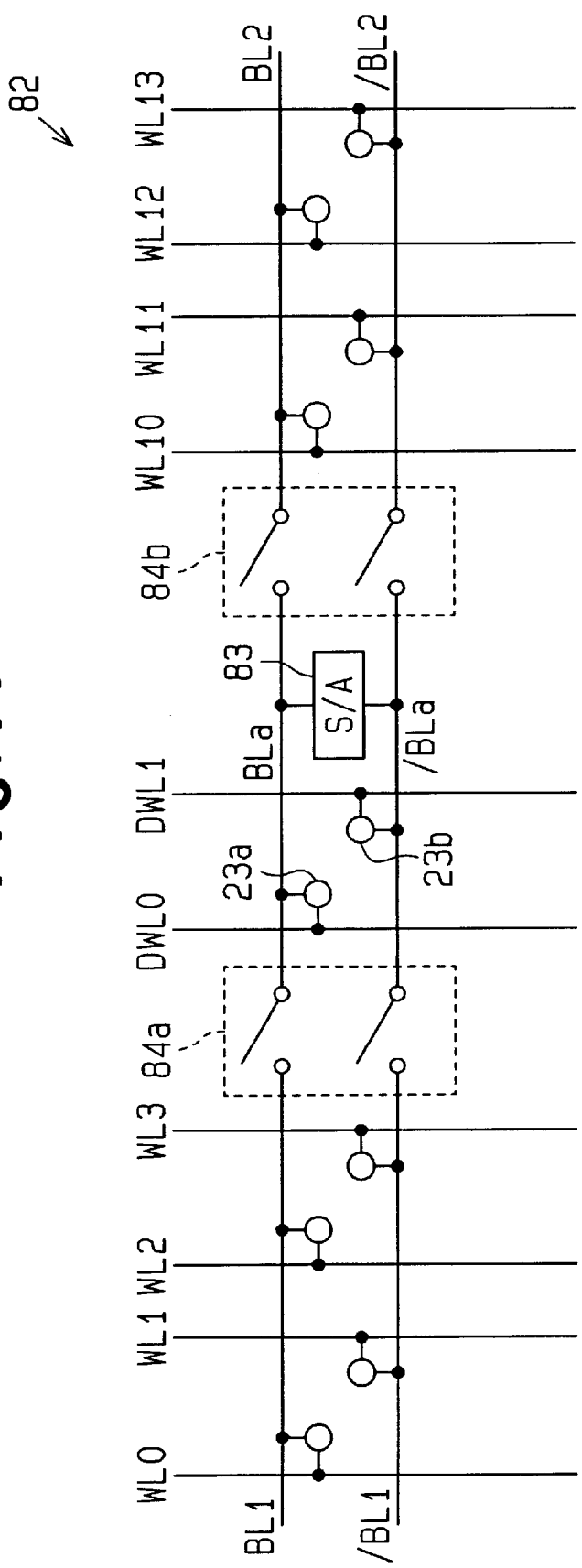
FIG. 19 is a partial block diagram of a semiconductor memory device according to a further embodiment of the present invention.

Further, the present invention may be applied to a shared sense amplifier type SDRAM 82 as shown in FIG. 19. In this case, the sense amplifier 83 is connected between bit lines BLa, /BLa. The bit lines BLa, /BLa are separated from bit lines BL1, /BL1 of a memory cell area by a switch circuit 84a, which includes bit line separation transistors. The bit lines BLa, /BLa are separated from bit lines BL2, /BL2 of a memory cell area by a switch circuit 84b, which includes bit line separation transistors. The dummy cell 23a is connected to the separation bit line BLa, and the dummy cell 23b is connected to a separation bit line /BLa.

In this case, the same dummy cells 23a, 23b and dummy word lines DWL0, DLW1 are used for the two bit line pairs BL1, /BL1, BL2, /BL2. This reduces the chip size of the SDRAM 82. In an SDRAM other than the shared sense amplifier type, a switch circuit (bit line separation transistor) separates a bit line to which a memory cell is connected from a bit line to which a sense amplifier is connected.

Figure 20A:
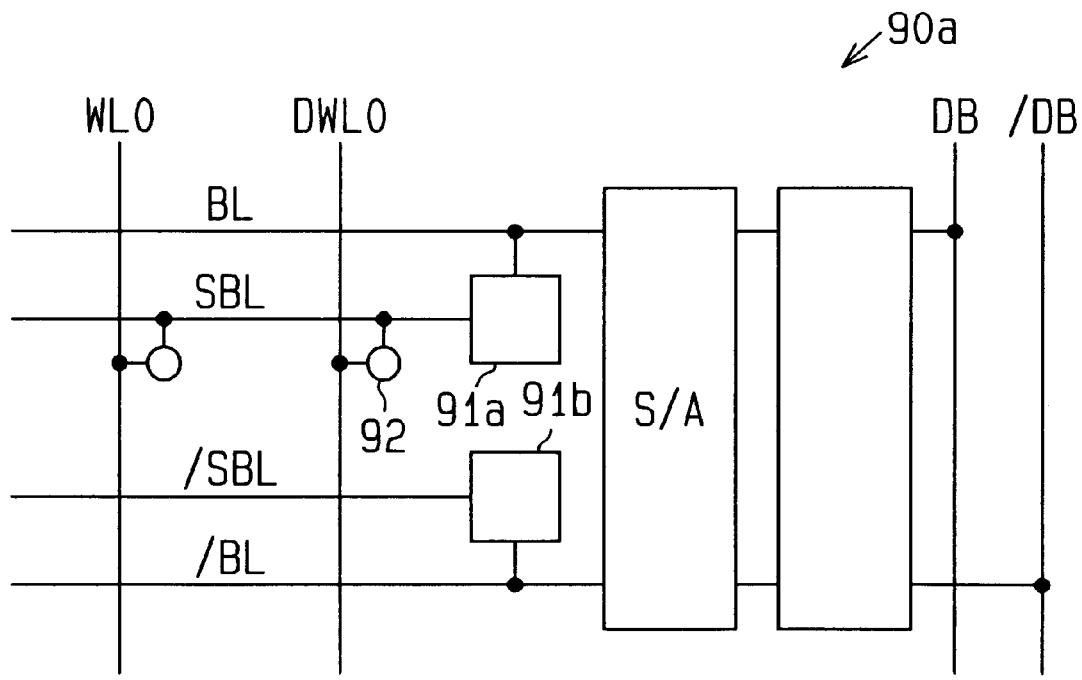
FIGS. 20A and 20B are partial block diagrams of semiconductor memory device according to a further embodiment of the present invention.
Figure 20B:
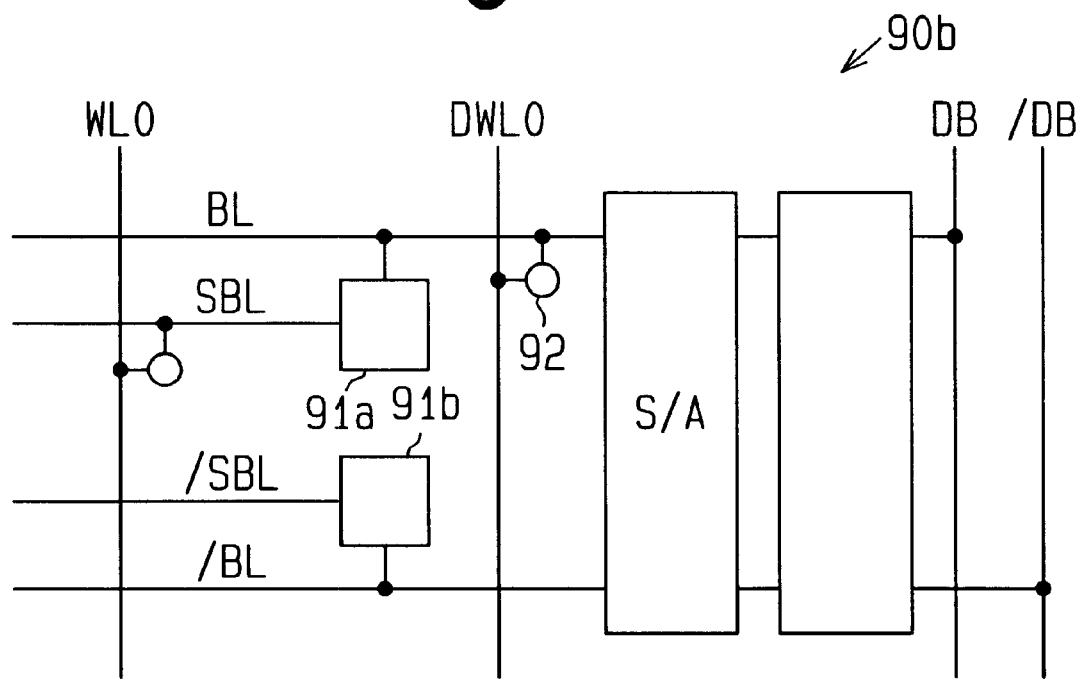

Further, as shown in FIGS. 20A and 20B, the present invention may be applied to SDRAMs 90a, 90b provided with bit lines having a hierarchy structure.

The SDRAM 90a of FIG. 20A includes a plurality (only one pair shown) of sub-bit lines SBL, /SBL connected to the bit lines BL, /BL via switch circuits 91a, 91b. A dummy cell is connected to an intersection between the sub-bit line SBL and the dummy word line DWL0.

The SDRAM 90b of FIG. 20B differs from the SDRAM 90a of FIG. 20A only in that the dummy cell 92 is connected to the intersection between the bit line BL and the dummy word line DWL0. The SDRAM 90b decreases the number of the dummy cells 92 and the dummy word lines DWL0 in comparison to the SDRAM 90a and decreases the chip size.

The capacitance of the dummy cell may be, for example, the same as a memory cell. In this case, the voltage supplied to the storage electrode of the dummy cell may be set at, for example, ¾ViiC or ¼ViiC.

The configurations of the dummy cells 23a–24b may be changed as required. FIG. 21A is a diagram showing the configuration of the memory cell 18a, and FIG. 21b is a diagram showing the configuration of the dummy cell 23a.

A dummy cell may be a fixed capacitor C, as shown in FIG. 21C. The charge of the fixed capacitor C increases or decreases the bit line voltage. In this case, the capacitance value of the fixed capacitor C is set so that the amount of change in the bit line voltage is greater than or equal to the sensitivity of the sense amplifier and less than or equal to a differential voltage produced at the pair of bit lines to which cell information is read. The capacitance value may be set by adjusting the line width of the dummy word line.

As shown in FIGS. 21D and 21E, the dummy cell may be an n-channel MOS transistor. In this case, referring to FIG. 21D, a dummy word line DWL is connected to the gate of the transistor, and the source and drain of the transistor is connected to bit line BL (or the inverting bit line /BL). Alternatively, referring to FIG. 21E, the gate of the transistor is connected to the bit line BL (or inverting bit line /BL), and the source and drain of the transistor is connected to the dummy word line DWL.

As shown in FIGS. 21F and 21G, the dummy cell may be a p-channel MOS transistor. In this case, referring to FIG. 21F, a dummy word line DWL is connected to the gate of the transistor, and the source and drain of the transistor is connected to bit line BL (or inverting bit line /BL). Alternatively, referring to FIG. 21G, the gate of the transistor is connected to the bit line BL (or the inverting bit line /BL), and the source and drain of the transistor is connected to the dummy word line DWL.

The voltage of the at least one of the word lines may increase from a reference voltage to an intermediate level of a sense amplifier source voltage. The voltage of the at least one of the word lines may increase from a reference voltage to a level that is lower than the sense amplifier source voltage by threshold value voltage of the cell transistor.

The present invention may be applied to an SDRAM including word lines formed to have a relatively small time constant. A word line having a relatively small time constant (resistance and parasitic capacitance) may be formed in the following manner. A plurality of parallel word lines are formed in the vertical direction of a chip and connected to contacts, which are arranged at proper intervals.

The present invention may be applied to an FCRAM, other types of RAMs, a ROM, and an EEPROM. FIG. 22 shows part of a flash memory 95. The flash memory 95 includes a current drive memory cell 97 and a dummy cell 96. In this case, the drive current of the dummy cell is set, for example, at half the drive current of the memory cell 97.

The present examples and embodiments are to be considered as illustrative and not restrictive, and the invention is not to be limited to the details given herein, but may be modified within the scope and equivalence of the following claims.

What is claimed is:

1. A semiconductor memory device comprising:
   a memory cell for holding charge of first cell information or second cell information, wherein the first cell information is associated with logic level "0" and the second cell information is associated with logic level "1";
   a word line connected to the memory cell for supplying the memory cell with word line voltage;
   a bit line connected to the memory cell for conveying the charge corresponding to the first or second cell information from the memory cell;
   a dummy cell connected to the bit line for supplying the bit line with complementary charge; and
   a dummy word line connected to the dummy cell for supplying the dummy cell with dummy word line voltage, wherein the memory cell supplies the bit line with the charge corresponding to the first cell information when the word line is activated, and wherein before the second cell information is read from the memory cell to the bit line, the dummy cell supplies the bit line with the complementary charge when the dummy word line is activated.

2. The semiconductor memory device according to claim 1, further comprising:
   a sense amplifier connected to the bit line for amplifying voltage at the bit line, wherein the dummy cell supplies the bit line with the complementary charge when the second cell information is read so that the voltage at the bit line changes to a value that is greater than or equal to a sensitivity voltage of the sense amplifier.

3. A semiconductor memory device comprising:
   a plurality of memory cells for storing first cell information or second cell information, wherein the first cell information is associated with logic level "0" and the second cell information is associated with logic level "1";
   a plurality of word lines connected to the memory cells for supplying the memory cells with word line voltage;
   a plurality of bit lines connected to the memory cells for conveying charge corresponding to the first or second cell information from one of the memory cells;
   a plurality of dummy cells respectively connected to the bit lines for supplying an associated one of the bit lines with complementary charge; and
   a plurality of dummy word lines respectively connected to the dummy cells for supplying the associated dummy cells with dummy word line voltage, wherein each memory cell supplies an associated one of the bit lines with the charge corresponding to the first cell information when an associated one of the word lines is activated, and wherein before the second cell information is read from one of the memory cells to the associated bit line, each dummy cell connected to an activated one of dummy word lines supplies the associated one of the bit lines with the complementary charge.

4. The semiconductor memory device according to claim 3, wherein the bit lines include a plurality of pairs of bit lines, each pair of bit lines including a bit line and an inverting bit line, the semiconductor memory device further comprising:
   a plurality of sense amplifiers connected to the pairs of bit lines for amplifying the voltage between the associated one of the pairs of bit lines, wherein the dummy cells supplies the associated one of the bit line with the complementary charge when the second cell information is read so that the voltage at the bit line changes to a value that is greater than or equal to a sensitivity voltage of the associated one of the sense amplifier.

5. The semiconductor memory device according to claim 4, wherein the bit line that receives the complementary voltage from the associated dummy cell when the second information is read is the inverting bit line that complements the bit line connected to the memory cell storing the second cell information.

6. A method for reading cell information from a semiconductor memory device, wherein the semiconductor memory device includes a plurality of memory cells for holding charge corresponding to first cell information or second cell information, a plurality of pairs of bit lines connected to the memory cells, each pair of bit lines including a bit line and an inverting bit line, the first cell information being associated with logic level "0" and the second cell information being associated with logic level "1", a plurality of word lines connected to the memory cells for supplying the memory cells with word line voltage, a plurality of bit lines connected to the memory cells for receiving charge corresponding to the first or second cell information from one of the memory cells, a plurality of dummy cells respectively connected to the pairs of bit lines for supplying an associated one of the pair of bit lines with complementary charge, a plurality of dummy word lines respectively connected to the dummy cells for supplying the associated one of the dummy cells with dummy word line voltage, and a plurality of sense amplifiers respectively connected to the pairs of bit lines for amplifying the voltage between the associated one of the pairs of bit lines, the method comprising:
   a first step for activating at least one of the word lines;
   a second step for providing the first cell information to the bit line associated with the memory cell connected to the activated one of the word lines from the memory cell;
   a third step for activating at least one of the dummy word lines;
   a fourth step for supplying the complementary charge to the bit line associated with the dummy cell connected to the activated one of the dummy word lines from the connected dummy cell; and
   a fifth step for activating the sense amplifier connected to the bit line supplied with the complementary charge before the second cell information is read to the bit line.

7. The method according to claim 6, wherein the third step is performed before the first step or at the same time of the first step.

8. The method according to claim 6, further comprising:
a sixth step for activating the word line so that a transient time of the word line voltage substantially corresponds to an activating time of a row address strobe signal.

9. The method according to claim 6, wherein a capacitor is connected between each of the dummy word lines and each of the bit lines, and wherein the third step includes a step for activating the capacitor to supply each of the bit lines with a charge amount that is less than a charge amount of each of the memory cells.

10. The method according to claim 6, wherein each of the bit lines includes a first bit line portion connected to the memory cells and a second bit line portion connected to the associated sense amplifier and wherein the first bit line portion and the second bit line portion are connected by a switch circuit and each of the dummy cells are connected to the second bit line portion.

11. The method according to claim 6, wherein the fourth step includes a step for changing voltage at the bit line that is supplied with the complementary charge in relation with voltage at the memory cells when storing the second cell information.

12. The method according to claim 11, wherein the third step includes increasing voltage at the dummy word line connected to the dummy cell that is associated with the bit line connected to the memory cell from which the first or second cell information is read when the dummy word line is activated.

13. The method according to claim 11, wherein the third step includes decreasing voltage at the dummy word line connected to the dummy cell that is associated with a bit line that complements the bit line connected to the memory cell from which the first or second cell information is read when the dummy word line is activated.

14. The method according to claim 6, wherein the fourth step includes a step for increasing voltage at the bit line supplied with the complementary charge in relation with voltage at the memory cells when storing the second information.

15. The method according to claim 6, wherein the semiconductor memory device further includes a word line voltage detection circuit for detecting a word line voltage to activate each of the sense amplifiers and wherein the fifth step further includes the steps of:
generating a detection signal based on the word line voltage detected by the word line voltage detection circuit;
generating an activation signal for activating the sense amplifier based on the detection signal; and
activating the sense amplifier based on the activation signal.

16. The method according to claim 15, wherein the detection signal generating step includes a step of comparing the detected word line voltage with a reference voltage and wherein the sense amplifier activating step includes a step of activating the sense amplifier when the detected word line voltage is greater than or equal to the reference voltage.

17. The method according to claim 16, wherein the comparing step includes comparing the detected word line voltage with the reference voltage that is equal to a sum of a precharge voltage and a threshold voltage of the memory cells.

18. The method according to claim 6, wherein the semiconductor memory device includes a word line voltage detection circuit for detecting a word line voltage to activate each of the sense amplifiers, and wherein the fifth step further includes the steps of:
generating a detection signal based on the word line voltage detected by the word line voltage detection circuit;
generating a sense amplifier activation signal for activating the sense amplifier based on the detection signal and an internal circuit activation signal for activating an internal circuit of the semiconductor memory device; and
activating the sense amplifier based on the sense amplifier activation signal.

19. The method according to claim 6, wherein the fifth step includes activating the sense amplifier when the word line voltage VWL relative to a precharge voltage Vpr and a threshold value voltage of the memory cells Vthcell satisfies a condition of VWL<Vpr+Vthcell.

20. A method for reading cell information from a semiconductor memory device, wherein the semiconductor memory device includes a plurality of memory cells for holding charge corresponding to first cell information or second cell information, a plurality of pairs of bit lines connected to the memory cells, each pair of bit lines including a bit line and an inverting bit line, the first cell information being associated with logic level "0" and the second cell information being associated with logic level "1", a plurality of word lines connected to the memory cells for supplying the memory cells with word line voltage, a plurality of bit lines connected to the memory cells for receiving charge corresponding to the first or second cell information from one of the memory cells, a plurality of dummy cells respectively connected to the pairs of bit lines for supplying an associated one of the pair of bit lines with complementary charge, a plurality of dummy word lines respectively connected to the dummy cells for supplying the associated one of the dummy cells with dummy word line voltage, and a plurality of sense amplifiers respectively connected to the pairs of bit lines for amplifying the voltage between the associated one of the pairs of bit lines, and wherein the semiconductor memory device has a cell transistor threshold value voltage of each of the memory cells, a precharge voltage, a first sum voltage of the threshold value voltage and the precharge voltage, a write voltage for writing the second information to the memory cell, and a second sum voltage of the write voltage and the threshold value voltage, the method comprising:
a first step for increasing voltage of at least one of the word lines from a reference voltage to a value greater than or equal to the threshold value voltage and less than the first sum voltage;
a second step for providing the charge corresponding to the first cell information to the bit line associated with the memory cell connected to the at least one of the word lines;
a third step for activating at least one of the dummy word lines;
a fourth step for supplying the complementary charge to the bit line associated with the dummy cell connected to the activated one of the dummy word lines from the connected dummy cell;
a fifth step for activating the sense amplifier connected to the bit line supplied with the complementary charge before the second cell information is read to the connected bit line from the memory cell; and a sixth step for increasing voltage at the at least one of the word lines to a value that is greater than or equal to the second sum voltage.

21. The method according to claim 20, wherein the first step includes holding a step up voltage of the at least one of the word lines for a predetermined time.

22. The method according to claim 21, wherein the step up voltage is equal to a memory cell voltage when the memory cell stores the second cell information.

23. The method according to claim 20, wherein the first step includes holding a step up voltage of the at least one of the word lines for a predetermined time and wherein the third, fourth, and fifth steps are performed during the predetermined time when the step up voltage of the at least one of the word lines is being held.

24. The method according to claim 20, wherein the first step includes increasing voltage of the at least one of the word lines to an intermediate level of a sense amplifier source voltage.

25. The method according to claim 20, wherein the first step includes increasing voltage of the at least one of the word lines to a level that is lower than a sense amplifier source voltage by the threshold value voltage.

* * * * *